(12) United States Patent
Wiegand et al.

(10) Patent No.: US 8,233,532 B2
(45) Date of Patent: Jul. 31, 2012

(54) INFORMATION SIGNAL, APPARATUS AND METHOD FOR ENCODING AN INFORMATION CONTENT, AND APPARATUS AND METHOD FOR ERROR CORRECTING AN INFORMATION SIGNAL

(75) Inventors: Thomas Wiegand, Berlin (DE); Cornelius Hellge, Berlin (DE); Thomas Schierl, Berlin (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 1289 days.

(21) Appl. No.: 11/859,464

(22) Filed: Sep. 21, 2007

(65) Prior Publication Data

US 2009/0080510 A1    Mar. 26, 2009

(51) Int. Cl.
H04B 1/66    (2006.01)

(52) U.S. Cl. ............... 375/240.02; 375/240.25; 714/774

(58) Field of Classification Search ........... 375/240–241
See application file for complete search history.

(56) References Cited

U.S. PATENT DOCUMENTS

| | | | | |
|---|---|---|---|---|
| 5,805,223 | A * | 9/1998 | Shikakura et al. | 375/240.12 |
| 5,825,931 | A * | 10/1998 | Owada et al. | 382/236 |
| 6,219,157 | B1 * | 4/2001 | Shikakura et al. | 358/426.04 |
| 7,200,181 | B2 | 4/2007 | Min-Goo | |
| 2006/0114993 | A1 * | 6/2006 | Xiong et al. | 375/240.11 |
| 2006/0120464 | A1 * | 6/2006 | Hannuksela | 375/240.27 |
| 2007/0104225 | A1 | 5/2007 | Mizuochi et al. | |
| 2009/0060044 | A1 * | 3/2009 | Suh et al. | 375/240.16 |

FOREIGN PATENT DOCUMENTS

RU    2236756    9/2004

OTHER PUBLICATIONS

A. Bouabdallah, J. Lacan, Dependency-aware unequal erasure protection codes, Journal of Zhejiang University Science A 2006 7(Suppl. I):27-33.
H. Schwarz, D. Marpe, and T. Wiegand, Overview of the Scalable Video Coding Extension of H.264/AVC, IEEE Transactions on Circuits and Systems for Video Technology, Special Issue on SVC, to be published in Oct. 2007.
Y.-K. Wang, M.M. Hannuksela, S. Pateux, and A. Eleftheriadis, System and Transport Interface to SVC, IEEE Transactions on Circuits and Systems for Video Technology, Special Issue on SVC, to be published in Oct. 2007.
B. Girod, U. Horn and B. Belzer, Scalable Video Coding With Multiscale Motion Compensation and Unequal Error Protection, in Proc. International Symposium on Multimedia Communications and Video Coding, New York, Oct. 1995.

(Continued)

*Primary Examiner* — Ayaz Sheikh
*Assistant Examiner* — Mounir Moutaouakil
(74) *Attorney, Agent, or Firm* — Michael A. Glenn; Glenn Patent Group

(57) ABSTRACT

A scalable information signal is protected in a more efficient and/or safe way by adopting the inter-relationship among the plurality of portions of different levels within the information signal in FEC protecting the information signal. In particular, portions of the information signal representing the information content at a higher level should have associated therewith redundancy information which is dependent not only on that part of this portion being disjoint to a respective overlapping lower level portion. Rather, redundancy information should also be dependent on the latter part so as to increase the chances of success of forward error correcting an error within the lower level portion at the reception side.

38 Claims, 18 Drawing Sheets

OTHER PUBLICATIONS

S. McCanne, V. Jacobson and M. Vetterli, Receiver-driven layered multicast. In Proc. of ACM SIGCOMM'96, pp. 117-130, Stanford, CA, Aug. 1996.

M. Luby, "LT-codes", in Proceedings of the ACM Symposium on Foundation of Computer Science (FOCS), 2002.

M. Luby, A. Shokrollahi, M. Watson and T. Stockhammer, Raptor Forward Error Correction Scheme for Object Delivery, draft-ietf-rmt-bb-fec-raptor-object-09 (work in progress), Jun. 28, 2007.

R.G. Gallager, Low-Density Parity-Check Codes, IRE Trans. Inform. Theory, vol. IT-8, pp. 21-28, Jan. 1962.

Mattia C.O. Bogino, Pasquale Cataldi, Marco Grangetto, Enrico Magli, Gabriella Olmo, "Sliding-Window Digital Fountain Codes for Streaming of Multimedia Contents", IEEE 2007.

A. Albanese, J. Blomer, J. Edmonds, M. Luby and M. Sudan, "Priority encoding transmission,"IEEE Trans. on Information Theory, 42(6):1737-1744, 1996.

A. Shokrollahi, "Raptor codes," Digital Fountain, Tech. Rep. DR2003-06-001, Jun. 2003.

M. Luby, M. Watson, T. Gasiba, T. Stockhammer and W. Xu, "Raptor Codes for Reliable Download Delivery in Wireless Broadcast Systems," IEEE CCNC, Las Vegas, NV, Jan. 2006.

E. N. Gilbert, "Capacity of a burst-noise channel," Bell Systems Technical Journal, vol. 39, pp. 12531265, 1960.

M. Hannuksela, V. Vadakital and S. Jumislo-Pyykk, "Comparison of Error Protection Methods for Audio-Video Broadcast over DVB-H", EURASIP Journal on Advances in Signal Processing vol. 2007, Arcticle ID 71801, 12 pages, 2007.

MacKay, "Fountain Codes".

Schierl, T., et al.; Multi Source Streaming for Robust Video Transmission in Mobile Ad-Hoc Networks; IEEE; 2006.

Dumitrescu, et al.; "Globally Optimal Uneven Error-Protected Packetizaton of Scalable Code Streams"; Apr. 1, 2004; IEEE Transactions on Multimedia, IEEE Service Ctr., vol. 6 No. 2, pp. 230-239 XP011109134.

Stankovic, et al.; "Real-Time Error Protection of Embedded Codes for packet Erasure and Fading Channels"; Aug. 1, 2004; IEEE Transactions on Circuits and Systems for Video Technology, IEEE Service Ctr., vol. 14, No. 8, pp. 1064-1072 XP011115753.

\* cited by examiner

INFORMATION SIGNAL, APPARATUS AND METHOD FOR ENCODING AN INFORMATION CONTENT, AND APPARATUS AND METHOD FOR ERROR CORRECTING AN INFORMATION SIGNAL

TECHNICAL FIELD

The present application relates to information signals, such as media signals, encoding information content and the error correction of such information signals.

BACKGROUND

Media transmission is affected by information loss due to transmission errors in many transmission channels without Quality of Service (QoS).

One example of a media stream is a video bit stream. Due to the spatial and temporal dependency structure of modern video codecs like H.264/AVC or especially the scalable extension of H.264/AVC (SVC) [A1], the effect of losses on the decoded video quality mainly depends on which parts of the bit stream are affected.

In unidirectional channels forward error correction (FEC) technologies can be used to combat this losses. Many protection schemes have been proposed addressing this issue like unequal error protection (UEP) [A5] or priority encoding transmission (PET) [B3]. Both approaches give more protection to lower and more important layers. But first in [A2] it has been recognized, that generating protection over all depending layers also redundancy symbols of upper layers can help increasing protection for lower layers. This can be very beneficial in transmission schemes where multiple layers of a scalable video stream are transmitted simultaneous like e.g. layered multicast [A6].

Various dependency structures can be considered. One particular important dependency structure is introduced by motion compensation, where a reference picture is used to predict another picture. If a referenced picture or a slice of that reference picture is lost, pictures and slices that are referencing it are affected too. Therefore, in a sequence of pictures that reference each other, the first pictures in the chain are most important. A loss at some point typically affects all succeeding pictures in some way. Hence, it is desirable to protect as many pictures as possible in such a dependency chain.

Another set of dependency structures is introduced by SVC, where a base-layer is referenced by an enhancement layer. This enhancement layer can be further referenced by another enhancement layer and so on. Let l be the identifier of a layer out of 0 to L-1, where l=0 is the base layer, l=1 identifies the first enhancement layer referencing the base layer. In SVC, the loss of any layer x leads to unusable decoding results for all layers l>x referencing x. Therefore, priority must be given to correctly obtaining any layer<l when a certain quality is requested, represented by a particular value of l.

Forward error correction (FEC) can be used to enhance reliability of media transmission over non-QoS channels. Independent FEC protection as used by nowadays schemes of an enhancement layers does not take the relation of layers into account. In such a scheme, typically for a number of k source symbols, a number of p=n−k redundancy symbols are generated. Let us assume the usage of a maximum distance separable (MDS) FEC code, so that each number of erasures of symbols smaller or equal to p can be overcome. Even, when using stronger FEC protection (more redundancy symbols) for the more important lower layers (this is also known as unequal error protection), there is no guarantee, that in any error condition the reconstruction of relatively stronger protected layers is of higher probability than for less strong protected layers.

If a lower layer is lost, higher enhancement layers cannot be decoded due to missing references as depicted in FIG. 19. In this example layer 1 at time t is lost due to transmission error ("error"), so that layers with l>1 can not be decoded. Successfully received FEC protection of enhancement layers is useless.

SUMMARY

Thus, it is an object of the present invention to provide a forward error correction scheme that allows for a more effective and/or safe protection of scalable information signals.

According to an embodiment an information signal being scalable in a plurality of dimensions so that portions thereof represent information content at different constellations of levels of the plurality of dimensions, may be build such that at least a first one of the plurality of portions representing the information content at a level of a first one of the plurality of dimensions higher than a level in the first dimension at which a second one of the plurality of portions represents the information content, overlaps with the second portion,
at least a third one of the plurality of portions being different from the first portion and representing the information content at a level of a second one of the plurality of dimensions higher than a level in the second dimensions at which a fourth one of the plurality of portions represents the information content, overlaps with the fourth portion, and
the information signal is FEC protected by each of the different constellations having redundancy information associated therewith such that
  each redundancy information is dependent on the respective portion representing the information content at the respective constellation,
  the redundancy information associated with the constellation at which the first portion represents the information content is dependent on the first portion including a part thereof overlapping the second portion, and
  the redundancy information associated with the constellation at which the third portion represents the information content is dependent on the third portion including a part thereof overlapping the fourth portion.

According to a further embodiment encoding an information content into an information signal being scalable in a plurality of dimensions so that portions thereof represent the information content at different constellations of levels of the plurality of dimensions, may comprise
generating the plurality of portions so that at least a first one of the plurality of portions representing the information content at a level of a first one of the plurality of dimensions higher than a level in the first dimension at which a second one of the plurality of portions represents the information content, overlaps with the second portion, and that at least a third one of the plurality of portions being different to the first portion and representing the information content at a level of a second one of the plurality of dimensions higher than a level in the second dimensions at which a fourth one of the plurality of portions represents the information content, overlaps with the fourth portion, and
FEC protecting the information signal by associating redundancy information to each of the different constellations such that each redundancy information is dependent on the respective portion representing the information content at the respective constellation, the redundancy information associated with the constellation at which the first portion represents the information content is dependent on the first portion including a part thereof overlapping the second portion, and the redundancy information associated with the constellation at which the third portion represents the information content is dependent on the third portion including a part thereof overlapping the fourth portion.

According to a further embodiment an information signal representing an information content and being scalable so that portions thereof represent a time instant of the information content at different levels of quality, may be build such that at least a first one of the plurality of portions representing the information content at a first one of the different levels higher than a second one of the different levels at which a second one of the plurality of portions represents the information content, overlaps with the second portion; and the information signal is FEC protected by each of the different levels having redundancy information associated therewith such that each redundancy information is dependent on the respective portion representing the information content at the respective level, and the redundancy information associated with the first level is dependent on the first portion including a part thereof overlapping the second portion.

According to a further embodiment encoding an information content into an information signal representing the information content and being scalable so that portions thereof represent a time instant of the information content at different levels of quality, may comprise generating the plurality of portions so that at least a first one of the plurality of portions representing the information content at a first one of the different levels higher than a second one of the different levels at which a second one of the plurality of portions represents the information content, overlaps with the second portion; and FEC protecting the information signal by associating redundancy information to each of the different levels such that each redundancy information is dependent on the respective portion representing the information content at the respective level, and the redundancy information associated with the first level is dependent on the first portion including a part thereof overlapping the second portion.

According to a further embodiment error correcting an information signal being scalable so that portions thereof represent an information content at different levels of quality, wherein at least a first one of the plurality of portions representing the information content at a first one of the different levels higher than a second one of the different levels at which a second one of the plurality of portions represents the information content, overlaps with the second portion, wherein the information signal is FEC protected by each of the different levels having redundancy information associated therewith such that each redundancy information is dependent on the respective portion representing the information content at the respective level, and the redundancy information associated with the first level is dependent on the first portion including a part thereof overlapping the second portion, the apparatus may comprise:

correcting an error of the information signal within the second portion by use of the redundancy information associated with the first and second levels and a part of the first portion disjoint to the second portion; and deriving the information content at the second level of quality from the error corrected second portion with discarding the part of the first portion.

According to a further embodiment an information signal representing a 3D and/or audio information content and being scalable so that portions thereof represent the information content at different levels of quality, may be build such that at least a first one of the plurality of portions representing the information content at a first one of the different levels higher than a second one of the different levels at which a second one of the plurality of portions represents the information content, overlaps with the second portion, the information signal is FEC protected by each of the different levels having redundancy information associated therewith such that each redundancy information is dependent on the respective portion representing the information content at the respective level, and the redundancy information associated with the first level is dependent on the first portion including a part thereof overlapping the second portion.

According to a further embodiment encoding an 3D and/or audio information content into an information signal representing the 3D and/or audio information content and being scalable so that portions thereof represent the 3D and/or audio information content at different levels of quality, may comprise generating the plurality of portions so that at least a first one of the plurality of portions representing the information content at a first one of the different levels higher than a second one of the different levels at which a second one of the plurality of portions represents the information content, overlaps with the second portion; and FEC protecting the information signal by associating redundancy information to each of the different levels such that each redundancy information is dependent on the respective portion representing the information content at the respective level, and the redundancy information associated with the first level is dependent on the first portion including a part thereof overlapping the second portion.

The present invention is based on, inter alias, the finding that a scalable information signal may be protected in a more efficient and/or safe way by adopting the inter-relationship among the plurality of portions of different levels within the information signal in FEC protecting the information signal. In particular, portions of the information signal representing the information content at a higher level should have associated therewith redundancy information which is dependent not only on that part of this portion being disjoint to a respective overlapping lower level portion. Rather, redundancy information should also be dependent on the latter part so as to increase the chances of success of forward error correcting an error within the lower level portion at the reception side.

Further, the effect of an increase in the correction probability is enhanced when transferring the above finding to more than one scalability dimension of a multiple scalable information signal.

In other words, without having to increase the amount of redundancy information, the probability of an errorless reconstruction of the information content at any of the possible levels of quality may be increased. In even other words, it is possible to maintain the probability of a proper reconstruction even with decreasing the necessary amount of redundancy information within the information signal.

BRIEF DESCRIPTION OF THE DRAWINGS

In the following, embodiments are described in detail with respect to the figures, among which

DETAILED DESCRIPTION

Figure 1A:
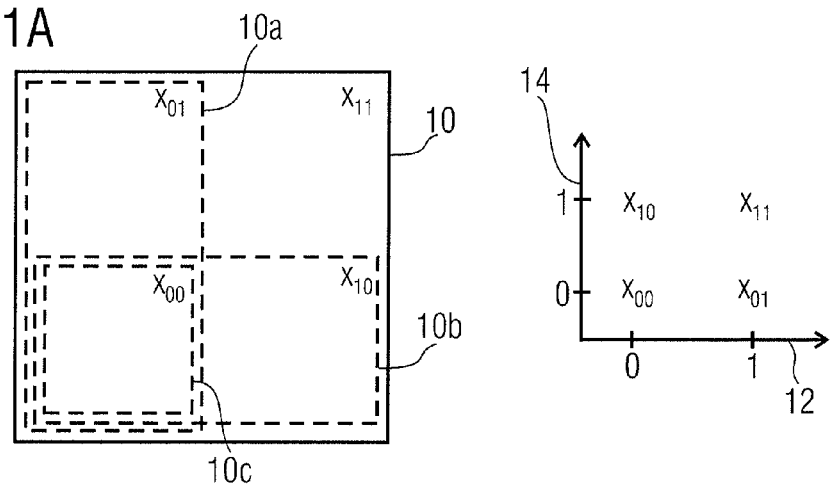
FIGS. 1a-1c show schematics of different examples for two-dimensionally scalable information signals for illustration purposes.
Figure 1B:
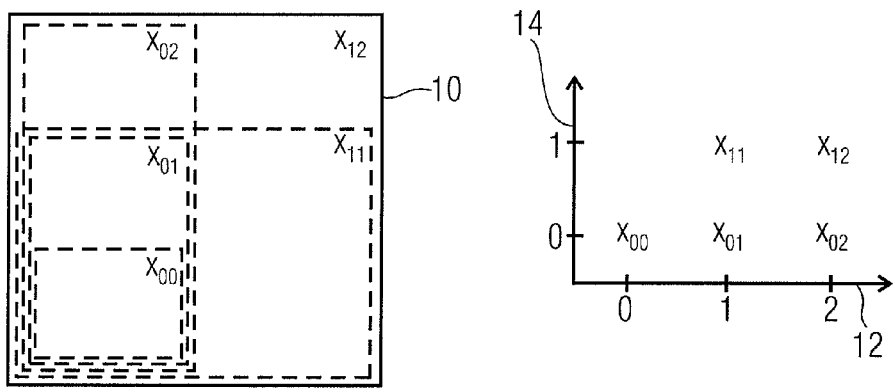
Figure 1C:
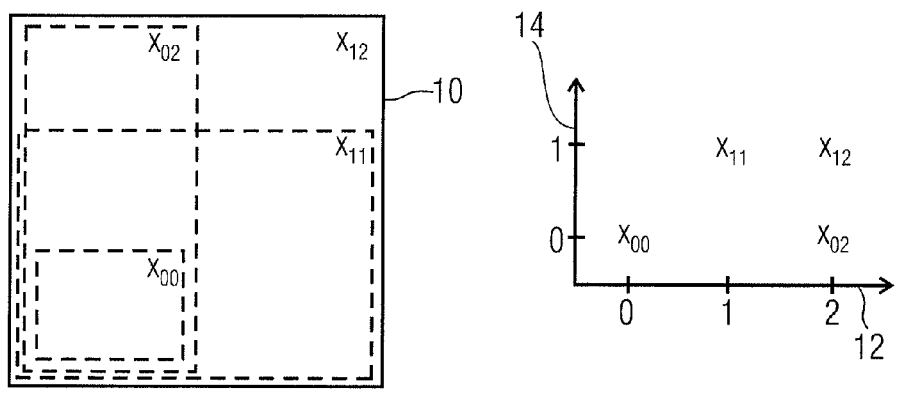

The following detailed description of embodiments starts with a presentation of possible 2-dimensionally scalable information signals with respect to FIGS. 1a-1c. By referring to these illustrative information signals, embodiments for an information signal protection at the encoder side and a possible error correction at a reception side are then described with respect to FIGS. 2-4. However, the embodiments described in the following with respect to FIGS. 2-18 are not restricted to 2-dimensionally scalable information signals. Rather, the information signal may exhibit more than two scalability dimensions or even merely one scalability dimension.

In the following description of FIGS. 1-4, the examples for information signals are not restricted to any application, such as video, audio or the like. In general, these embodiments are applicable to many types of information signals showing scalability as it is described in the following in more detail. Accordingly, although the subsequent description of FIGS. 5-18 sometimes focuses on the scalable video coding, even most of the aspects described with regard to these figures are transferable to other kinds of information signals as well. Moreover, in the description of the FIGS. 1-4, the scalability of an information signal is described to be the property of an information signal to represent an information content at different levels of quality. In effect, a scalable information signal may thus be viewed as a layered information signal with each layer corresponding to a certain level of representation quality. Accordingly, in the subsequent description of FIGS. 5-18, some of the principles described with respect to FIGS. 1-4 are referenced by "layered FEC".

FIG. 1a shows an example for an information signal being scalable so that portions thereof represent information content at different levels of quality. The information signal 10 is illustrated on the left-hand side of FIG. 1a. In particular, the information signal is illustrated as a rectangle. The area circumscribed by the rectangle shall correspond to the amount of data within the information signal. However, although the information signal 10 is illustrated as a 2-dimensional area, the data structure of the information signal shall not be restricted by this kind of illustration. Rather, the information signal may be a linear data stream in a packetized or non-packetized format. The 2-dimensional representation of the information signal 10 in FIG. 1a has merely been used in order to more clearly illustrate the way in which the information signal 10 provides for a scalable representation of an information content in two scalable dimensions.

In particular, four different portions of the information signal 10 are shown in FIG. 1a. The first portion is shown by the continuous line 10, with this portion 10 encompassing the whole information signal. The other three portions 10a, 10b and 10c are proper subsets of the information signal 10. Each of these sub-portions 10a-10c allows for a reconstruction of a representation of the information content, however, at a reduced level of quality compared to the whole information signal 10. In particular, sub-portion 10a represents the information content at a level 0 along a first scalability dimension 12. This level is lower than level 1 in the same scalability dimension direction 12, at which the whole information signal 10 represents the information content. Similarly, sub-portion 10b allows for a reconstruction of the information content at a level 0 in a second scalability dimension 14, which is lower than a level 1 at which the information content is represented when reconstructed based on the whole information signal.

Similar to the relationship between the whole information signal on the one hand, and the sub-portions 10a and 10b on the other hand, sub-portion 10c allows for a reconstruction of the information content at a level lower than achievable by use of any of sub-portions 10a and 10b, respectively, in any of the two scalability dimensions 12 and 14. In particular, according to the illustrative embodiment of FIG. 1a, the whole information signal allows for a reconstruction of the information content at the higher level of 1 in both scalability dimensions 12 and 14, while sub-portion 10c merely allows for a reconstruction of the information content at the lower level 0 in both scalability dimensions 12 and 14. The other sub-portions 10a and 10b are in between, in that they allow for a reconstruction of the information content at the higher level of 1 in one of the scalability dimensions 12 and 14, and at the lower level in the other of both scalability dimensions 12 and 14, as it is illustrated on the right-hand side of FIG. 1a.

As it is shown in FIG. 1a, the sub-portion 10c is a proper subset of both portions 10a and 10b. By this measure, the lower quality data within portion 10c is "re-used" in the higher level portions 10a, 10b and 10 respectively, in order to re-fine this lower quality data to enable a reconstruction of the information content at a higher level in any of the scalability dimensions 12 and 14, relative to portion 10c. Due to this, the data within portion 10c may be seen as more important than data outside this portion 10c. In particular, if the data within portion 10c is somehow corrupted, the information content is not correctly reconstructable, even at the lowest constellation of levels in the two dimensions 12 and 14. This is also true for the higher levels, due to their dependency on the data within portion 10c. Data loss outside portion 10c, however, does not hinder a reconstruction of the information content at, at least, the lowest constellation 00.

For the sake of completeness only, it is noted that each of the above-mentioned portions 10 and 10a-10c may represent individually decodable portions of the information signal in that each portion is self-contained to reconstruct the information content at the respective quality constellation without necessitating any information on data outside the respective portion. Further, the portions 10, 10a, 10b and 10c may be defined such that any data loss within the respective portion leads to an incorrect reconstruction of the information content compared to the quality constellation of the respective portion.

In the example of FIG. 1a, the information signal 10 was scalable in two dimensions such that for each level at which the information content was reconstructable in one dimension, full scalability was provided in the other dimension. However, this needs not necessarily be the case. For example, FIG. 1b shows an example of an information signal where the number of levels in the scalability dimension 12 is different from the number of levels in the other scalability dimension 14. To be more precise, while in FIG. 1a, the four portions 10 and 10a-10c corresponded to the four constellation points 10, 01, 00 and 11 shown on the right-hand of FIG. 1a, the information signal of FIG. 1b has five portions corresponding to the constellation points 00, 01, 02, 11 and 12 shown on the right-hand side of FIG. 1b.

Although in FIG. 1b, each constellation point at the higher level of the second scalability dimension 14 has a corresponding constellation point at the same level along the first scalability dimension 12, but at the lower level 0 in the second scalability dimension 14, this is also not necessary. For example, FIG. 1c shows a case where the smallest sub-portion representing the information content at the level 0 along the both scalability dimensions 12 and 14, i.e. at the constellation 00, is the only portion providing level 0 in the first dimension 12. Similarly, constellation point 11 is the only constellation point at level 1 along the first scalability dimension 12.

By looking at FIGS. 1a-1c it becomes clear that the intersection between the higher level portions such as, for example, 10, 10a and 10b in FIG. 1a, on the one hand, and the lower level portion 10c, on the other hand, not necessarily has to be equal for each of these high level portions. Rather, as it is shown in FIG. 1c, for example, the intersection itself may not be a member of the plurality of portions of the information signal. Moreover, it is noted that a portion of a level lower than that of another portion in at least one of the scalability dimensions does not necessarily have to be a proper subset of the latter portion, as it is commonly shown in FIGS. 1a-1c with respect to the smallest portion, respectively. Rather, the intersection between higher level portions and lower level portions may be such that the lower level portion merely partially overlaps with the respective higher level portion.

The embodiments described below with respect to FIGS. 2-4, adopt the above outlined dependency among the portions of the scalable information signal in FEC protecting the information signal and performing forward error correction on received versions of the information signal, respectively. In general, higher level or higher layer portions, i.e. portions representing the information content at a higher level in at least one scalability dimension, are associated with respective redundancy information which is not only dependent on the part of the respective portion being disjoint to overlapping lower level portions, but also on the part overlapping with the latter portions.

Figure 2:
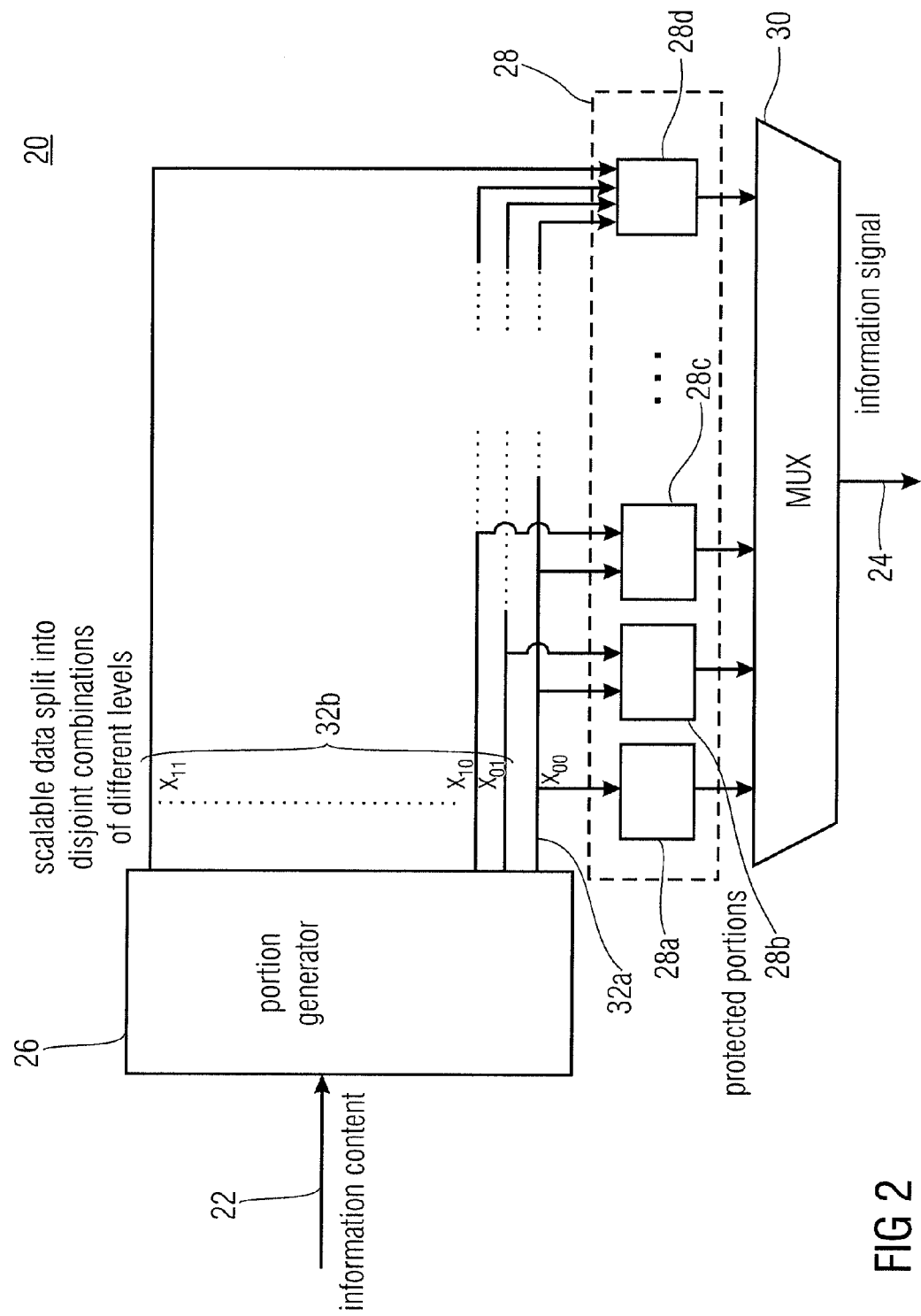
FIG. 2 shows a block diagram of an encoding apparatus according to an embodiment.

FIG. 2 shows an apparatus 20 for encoding an information content. The apparatus 20 comprises an input 22 for receiving the information content and an output 24 for a protected scalable information signal. Internally, apparatus 20 comprises a portion generator 26 representing a means for generating the portions of the informations signal, an FEC protector 28 representing a means for FEC protecting the information signal and a multiplexer 30, which are serially connected in the order mentioned between the input 22 and output 24.

The portion generator 26 is configured to encode the information content 22 into scalable data such as the information signal data shown in FIGS. 1a-1c, however, in an unprotected format. For example, the portion generator 26 may be configured to lossy compress the information content 22 in order to obtain lowest level or lowest layer portion data 32a such as, for example, $x_{00}$. To this end, portion generator 26 has, for example, reduced the quality of the information content 22 and then encoded the information content in its reduced quality. In this case, the portion generator 26 may be configured to accompany this lowest layer portion 32a by disjoint higher level portion data 32b which enables, in combination with the lowest level portion data 32a, an increase of the reconstructable quality in certain levels and in one or several scalability dimensions. For ease of understanding only, four different portions are shown to be output by portion generator 26, with these portions exemplarily corresponding to the configuration of FIG. 1a. However, differing from the representation of FIGS. 1a-1c, the portion data output by portion generator 26 is understood to be non-overlapping. That is, the portion data $x_{01}$ output by portion generator 26 shall encompass only that part of the data being necessary for that constellation $x_{01}$, which is disjoint to the lower level portion data of the lower level portion $x_{00}$, i.e. the upper right-hand corner of rectangle 10 in FIG. 1a. Similarly, the portion data for constellation $x_{10}$ output by portion generator 26 shall encompass only data within portion 10b of FIG. 1a, which does not overlap the lower layer portion 10c. And the highest level portion data $x_{11}$ output by portion generator 26 shall, in turn, only encompass data of the information signal of FIGS. 1a-1c not being included by any of the sub-portions.

The unprotected plurality of disjoint portions is then FEC protected by FEC protector 28. In particular, the FEC protector 28 comprises a plurality of modules 28a-d, each module 28a-28d being uniquely associated to a different one of the portions output by portion generator 26, or the a different one of the quality levels/layers to which the portions correspond. Each module 28a-d performers an FEC protection on its respective portion data. However, in addition to the respective disjoint portion data, each module 28a-d receives data of lower level portions contributing or being necessary for the respective quality level. For example, module 28b is associated with quality constellation $x_{01}$ and receives the disjoint portion data $x_{01}$ output by portion generator 26 along with the lowest level portion data 32a. By this measure, module 28d receives the whole portion data 10a (FIG. 1a). Thus, each module 28a-d performs the FEC protection on all data necessary for reconstructing the information content at the respective level of quality to which the associated portion data of the that module is assigned. In other words, each of the modules 28a-d is, in effect, associated to a different one of the quality levels or quality constellations in units of which the unprotected information signal output by portion generator 26 is scalable, and each of these modules performs the FEC protection on all data participating or being necessary for the respective quality level or quality constellation. Thus, the redundancy information which module 28b, for example, associates with the higher level portion data $x_{01}$ also depends on and protects the lower level portion data 32a, for example.

Each module 28a-d outputs the respective disjoint portion data along with the respective redundancy information obtained by the respective FEC protection. Although examples for FEC protection used by FEC protector 28 are described in the following description in more detail, it is noted that FEC protector 28 and its modules 28a-d, respectively, may, for example, use a systematic code for the redundancy information generation. However it is also possible that the FEC modules 28a-d use a non-systematic code in that they map the data received such that the lower portions' data are used for creating encoded code words representing the respective portion data associated with the respective module mixed-up with the redundancy information in an non-systematic way. An example for such a non-systematic code is given in the following by an LT code.

The multiplexer 30 receives the protected portions from the FEC protector 28 and multiplexes them into the protected information signal 24 offering the same scalability as the unprotected information signal output by portion generator 26, but in a protected manner. Each of these protected higher level disjoint portions has redundancy information that protects also protected disjoint portions of lower levels. Still, the various overlapping portions of the protected information signal at output 24 which enable reconstruction at different levels are individually decodable in order to enable the reconstruction of the information content at the respective level without necessitating any information from the remainder of the protected information signal. The protected information signal 24 may be arranged in consecutive time frames as a data stream wherein each protected disjoint portion may assume a continuous portion of this data stream so that the respective redundancy information is close to the respective disjoint portion.

Figure 3:
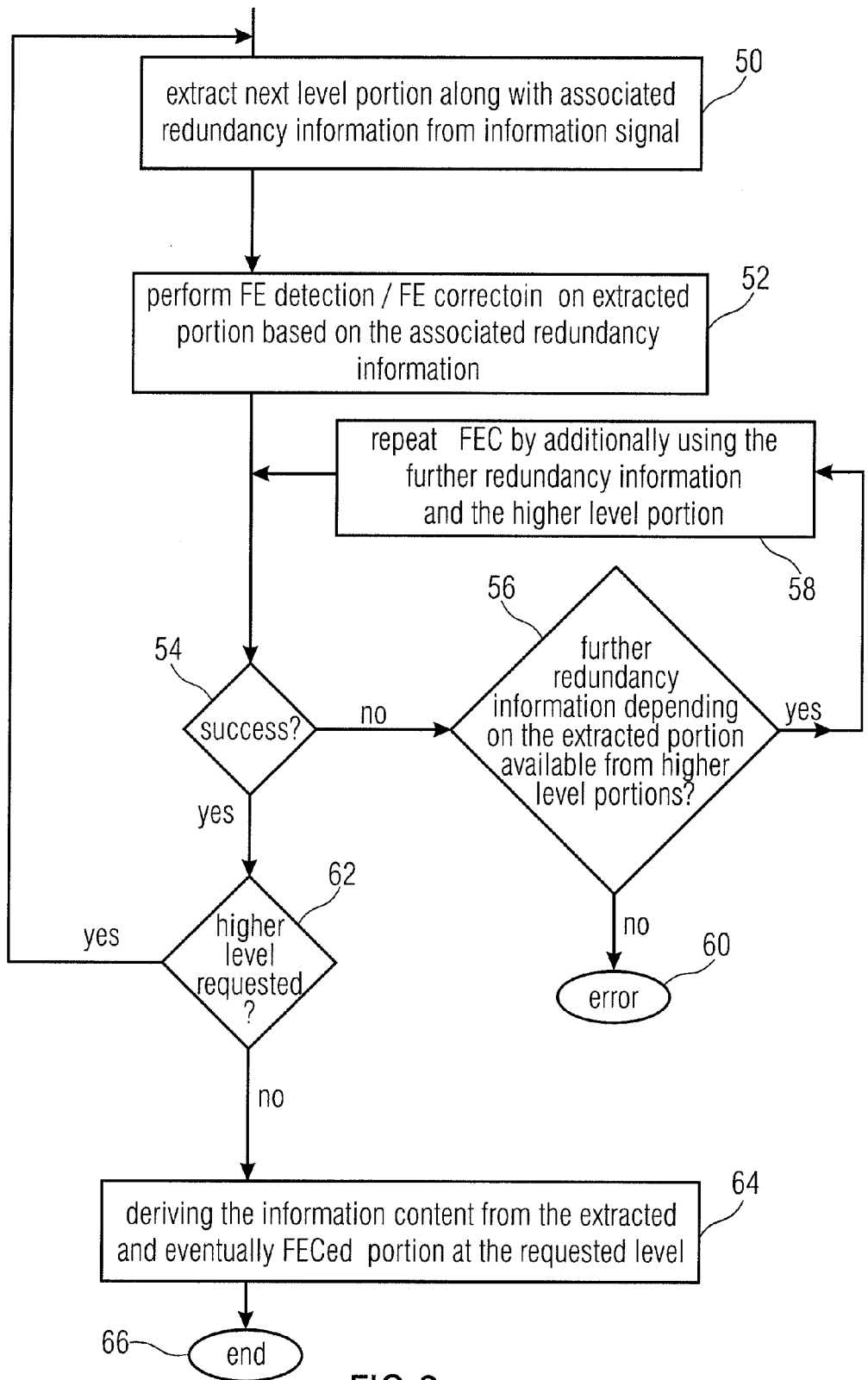
FIG. 3 shows a flow diagram of a correction method according to an embodiment.

The protected information signal thus generated by apparatus 20 may be error corrected at reception site by use of the method shown in FIG. 3.

The method of FIG. 3 begins with step 50, where a level portion is extracted from the protected information signal along with its associated redundancy information. For example, the first time step 50 is performed, the lowest level protected portion is extracted from the protected information signal, i.e. portion 10c of FIG. 1a along with its redundancy information. Thereafter, in step 52, a forward error detection or forward error correction is performed on the extracted portion based on the associated redundancy information. Depending on the severeness of errors occurring in the data extracted in step 50, the forward error correction step 52 is successful or not. In step 54, it is checked as to whether the forward error correction in step 52 has been successful or not. If not, the process proceeds with step 56, where it is checked as to whether further redundancy information depending on or protecting the extracted portion is available from higher level portions. For example, if the currently extracted portion is 10c in FIG. 1a, the check in step 56 reveals that the redundancy information of portions 10a and 10b also protects portion 10c. If such further redundancy information exists, a further attempt of a forward error correction is performed in step 58 by additionally using the further redundancy information and the higher level portion identified in step 56. Thereafter, the check in step 54 is performed again. If, in step 56, it is determined that no further redundancy information exists, the correction has failed and the method ends up with an error 60.

However, the conditional attempt 58 increases the probability of a successful error correction of the extracted portion. If the check in step 54 reveals a successful correction, the method proceeds to step 62, where it is checked as to whether a higher level of quality is requested by, for example, a user or a default setting at the receiver. If yes, the method proceeds with step 50, i.e. by extracting the next level portion. Naturally, this extraction may be restricted to disjoint parts of the next level portion, i.e. the part of the next level portion disjoint to the previous portions having previously been extracted. Moreover, the extraction may already have been performed within step 58, in which case a re-extraction may be skipped also. However, if the check in step 62 reveals that no higher level is requested, the information content is derived from the extracted and eventually forward error corrected portion at the requested level in step 64, whereupon the method ends successfully at 66.

According to FIG. 3, the error correction of a lower level portion is firstly restricted to the associated redundancy information. In other words, a first attempt is performed in order to error correct this portion by use of its associated redundancy information only. Merely in case of a miss, redundancy information of higher level portions is used additionally. Of course, according to a simpler approach, shown in FIG. 4, the redundancy information of higher level portions may be used instantaneously in order to participate in the error detection and error correction of lower level portions. FIG. 4 shows such a procedure. In a step 70, an error of the information signal within the portion of the requested level is corrected by use of the redundancy information associated with the requested level along with redundancy information associated with higher levels and a part of the higher level portions disjoint to the requested level portion. For example, in order to correct errors within portion 10c in FIG. 1a, in step 70 an error correction is performed by use of not only the redundancy information associated with portion 10c, but also with the redundancy information associated with portion 10a and/or 10b in the part of the respective higher level portion 10a and 10b, respectively, disjoint to lower level portion 10c. Thereafter, in step 72 the information content at the requested level is derived from the error corrected portion by discarding the part of the higher level portions disjoint to the requested level portion.

Figure 4:
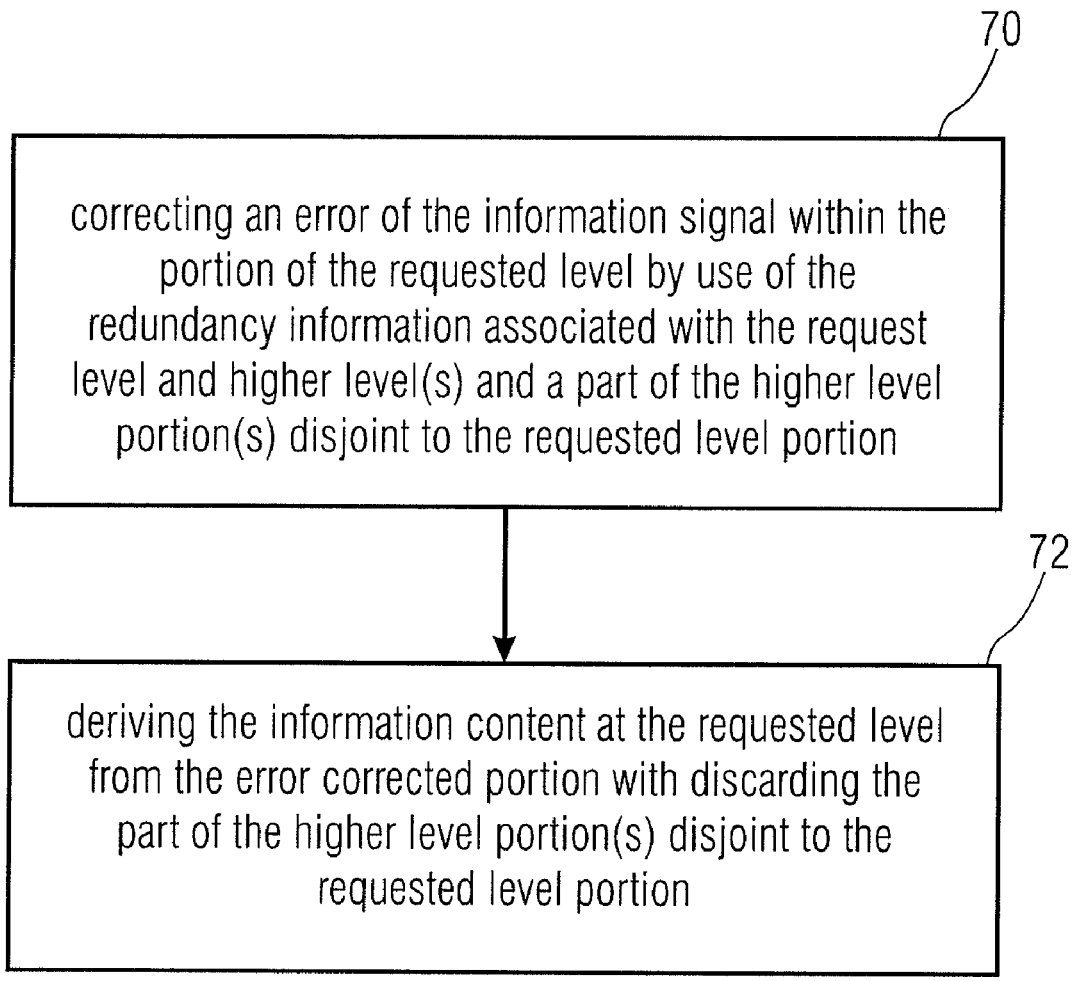
FIG. 4 shows a flow diagram of a method for an error correction according to a further embodiment.

Before starting with the description of the following Figures, it is noted as a precautionary measure that a scalable information signal applicable to the embodiments of FIGS. 2 to 4 may show scalability in a higher number of dimensions than used or adopted in the provision of the FEC data. In other words, the dependencies of the information signal adopted when creating the FEC data may involve merely a proper subset of the scalability dimensions of the information signal. By referring to FIG. 1a to 1c, for example, the layered FEC described above and described in more detail below may be restricted to only one of the two dimensions 12 and 14.

The above embodiments were described without restriction to any kind of application, such as video coding or the like. Moreover, the kind of forward error correction used for protecting the individual quality levels has not been discussed in detail. The same applies to the kind of scalability or the different possibilities for scalability dimensions. Examples for these terms may be derived from the following embodiments, the description of which sometimes refers back to any of FIGS. 1-4. In particular, the following embodiments are sometimes exemplified by reverting to media streams, in particular video bit streams. The embodiments described in the following also use the layered forward error correction outlined above in that FEC protection for each higher layer of a scalable video codec is concatenated. However, although the following embodiments mainly refer to scalable video coding, same embodiments could also be applied to any data representation including scalable audio, computer graphics data and scene descriptions, where a subset of the data relies on the correctness of another subset of the data.

Figure 5:
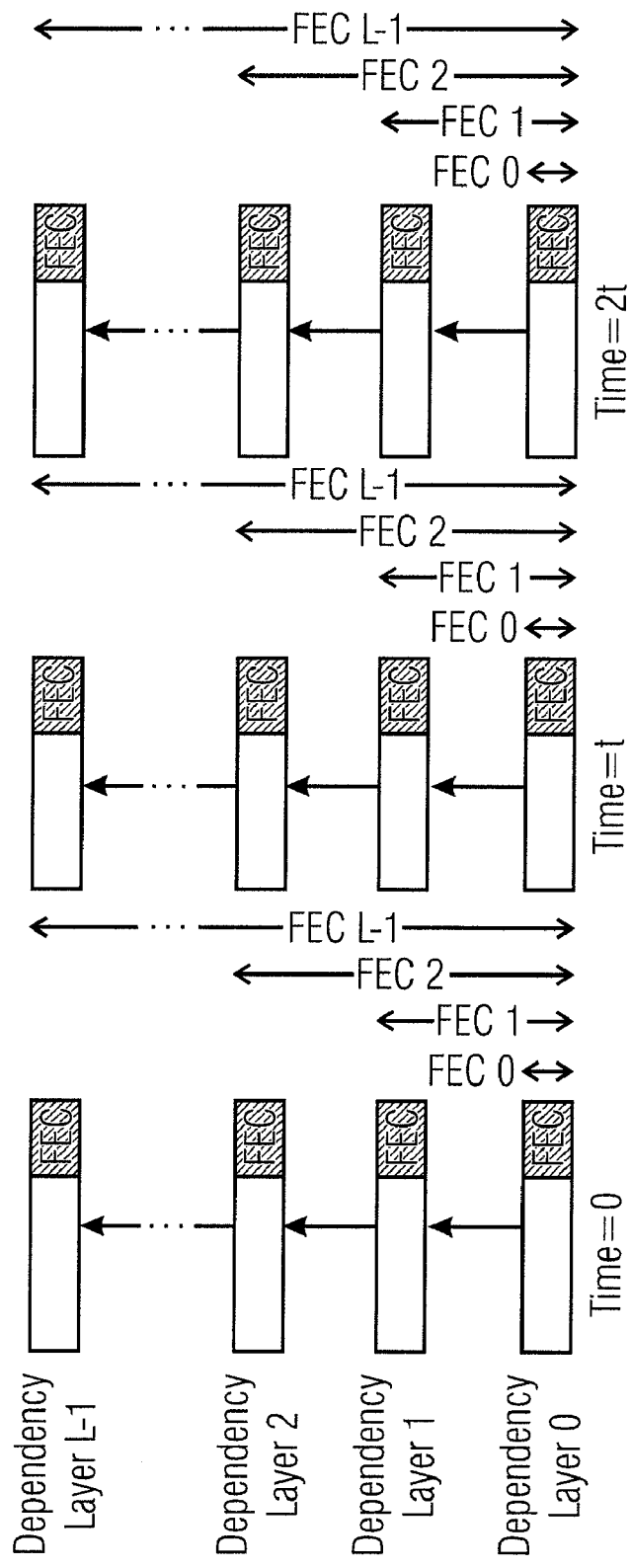
FIG. 5 shows a schematic illustrating the correspondence between the inter-relationship among the different layers of a multi-layered information signal on the one hand and the dependency of the redundancy information on the different portions on the other hand, according to an embodiment.

FIG. 5, for example, shows an example for a dependency structure of a media stream. A media stream is arranged in consecutive time frames, with time frames 0, t and 2t being shown in FIG. 5. The media stream is shown to be multi-layered. In particular, the media stream has L dependency layers. The lowest dependency layer 0 may be thought of corresponding to the level 0 along axis 14 of FIG. 1b, with dependency layer 1 corresponding to the level 1 along this axis, the dependency level 2 corresponding to level 2. According to FIG. 5, redundancy symbols for an enhancement layer are calculated over the source symbols of all subjacent referenced layers like depicted in example FEC construction in FIG. 5. Additional protection is added to lower layers without increasing the overall amount of FEC redundancy symbols of the whole media stream, i.e. for all layers. The double-headed arrows in FIG. 5 show which layers are used for FEC redundancy symbol generation. The maximum number of dependency layers is L in this example.

FEC redundancy symbols for the lowest layer Layer 0 (FEC 0) are generated given by some FEC coding technique T. FEC 1 (layer 1) symbols are generated over source symbols of layer 0 and layer 1 whereas FEC 2 (layer 2) symbols are generated over source symbols of layer 0, layer 1 and layer 2 and so on, up to FEC L-1 which is generated over all layers 0 to L-1. The generations of these FEC symbols may be performed by the modules shown in FIG. 2.

FEC 0 symbols can independently be used for the decoding of FEC scheme T. Layer 1 may only be corrected in combination with layer 0. Redundancy symbols of both layers are used in a combined way for reconstructing layer 1 and layer 0 together. If there are not more symbols lost than the sum of transmitted symbols FEC 0 and FEC 1, both layers can be reconstructed, i.e. a symbol loss in the base layer higher than the base layer redundancy symbols FEC 0, can be overcome, if there are enough redundancy symbols FEC 1 left in layer 1 for reconstructing both layers: The sum of all transmitted symbols $n_1$ of layer 1 and all transmitted symbols $n_2$ of layer 2 must be higher or equal to $k_1+k_2$.

The layered FEC of FIG. 5 thus exploits existing dependencies in a bit stream to generate layer comprehensive redundancy or parity symbols in upper layers with l>0 by calculating redundancy symbols for an enhancement layer over the source symbols of all subjacent referenced layers like depicted in example FEC construction in FIG. 5, with the double arrows showing which layers are used for FEC redundancy symbol generation for the related layer.

As has been described, with the media bit stream being split into L dependency layers, redundancy symbols (FEC 0) of lowest layers l=0 may be generated given by the FEC coding technique T. FEC 1 (layer 1) symbols may be generated over source symbols of layer 0 and layer 1. Furthermore FEC 2 (layer 2) symbols may be generated over source symbols of layer 0, layer 1 and layer 2 and so on up to FEC L-1 which is generated over source symbols of all subjacent layers 0 to L-1. A possible encoding and decoding scheme for the FEC symbols is now exemplified with a XORing code over two layers on the bit level with n−k=2 redundancy bits (with k being the number of source/unprotected bits and n being the number of protected bits including payload data and redundancy). However, it is noted that the layered FEC protection described above may be used with any other FEC technique such as, for example, techniques that use XOR combinations for generating redundancy symbols.

Layer 0 symbols are, for example, generated using one particular FEC technique. XORing information bits of the k-bit vector $I_0=\{i_{00}, \ldots, i_{0k-1}\}$ results in redundancy symbols (here bits) $P_0=\{p_{01}, \ldots, p_{0n-k}\}$. To construct a systematic code word, $P_0$ is concatenated with $I_0$ building code word $C_0$, in the following sometimes called Constellation 0. In the example in FIG. 5 and FIG. 3, n−k=2 has been used for illustrative reasons.

Figure 6:
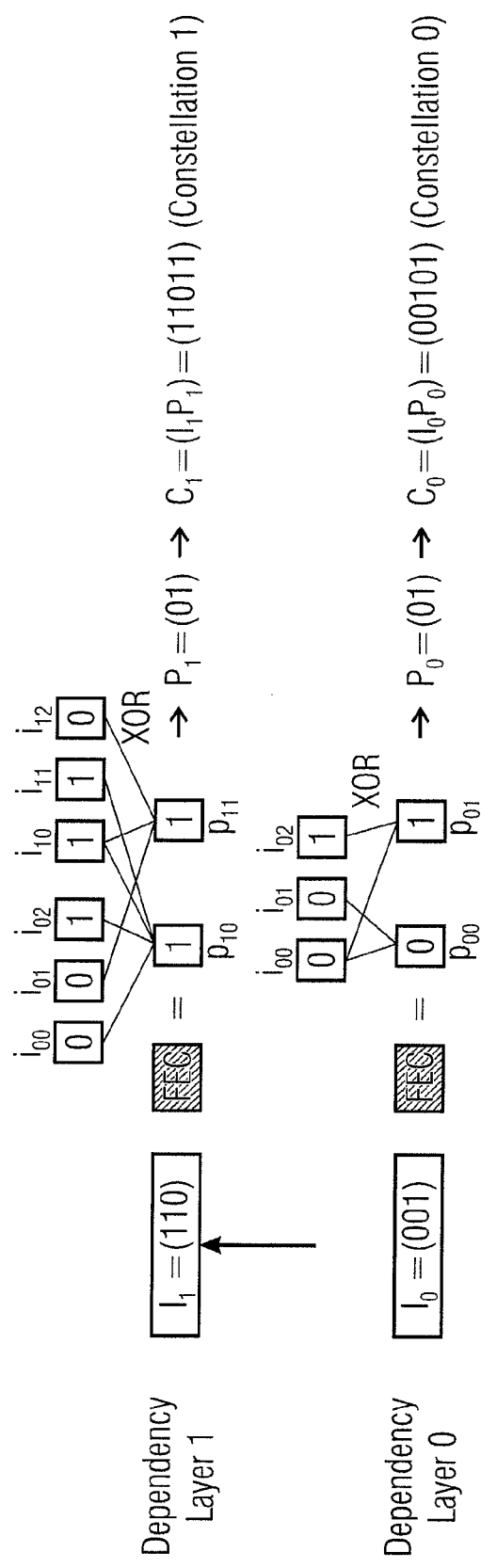
FIG. 6 shows a schematic for illustrating an encoding example for layered FEC with two layers, using an XORing code.

The bits in the set $P_1$ of dependency layer 1 are calculated in Constellation 1 over source symbols of dependency layer 1 and subjacent layer 0, i.e. in combination with source symbols of layer 0 on which layer 1 depends on. Therefore, the redundancy vector $P_1$ is an XOR combination of $I_0$ and $I_1$. The systematic code word $C_1$ is a concatenation of source bits $I_1$ and $P_1$. FIG. 6 depicts encoding of two dependency layers with the thus embodied layered FEC.

Due to the additional XORing combinations of the layered FEC approach redundancy symbols (bits) of different layers can be combined to correct erasures in source symbols of all layers included in Constellations.

Figure 7:
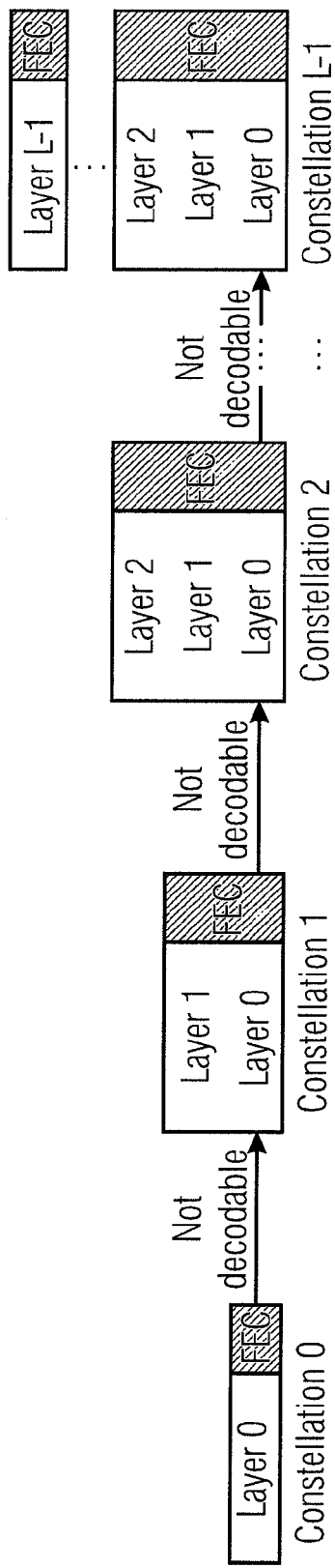
FIG. 7 shows a schematic for illustrating a possible layered FEC with exemplary L dependency layers.

If L is the number of dependency layers, then FIG. 7 depicts all possible encoding and decoding Constellations 0 to L-1 depending on number of available layers L.

If there are errors in Layer 0, each Constellation can be used for error correction (see step 70). For a lower computation complexity the lowest Constellation 0 may be tried first for correcting errors (see FIG. 6). If it fails (step 54), the next Constellation 1 is tried (step 58) and so on. If the last Constellation L-1 fails too, the errors in layer 0 cannot be corrected (step 60). If, on the other hand, layer 0 can be reconstructed data may be used for decoding higher Constellations but do not give any protection gain due to no XORing connections from lower to upper layers. In other words, if layer 0 can be reconstructed, the data in Constellation 1 can be used to reconstruct layer 1.

Figure 8:
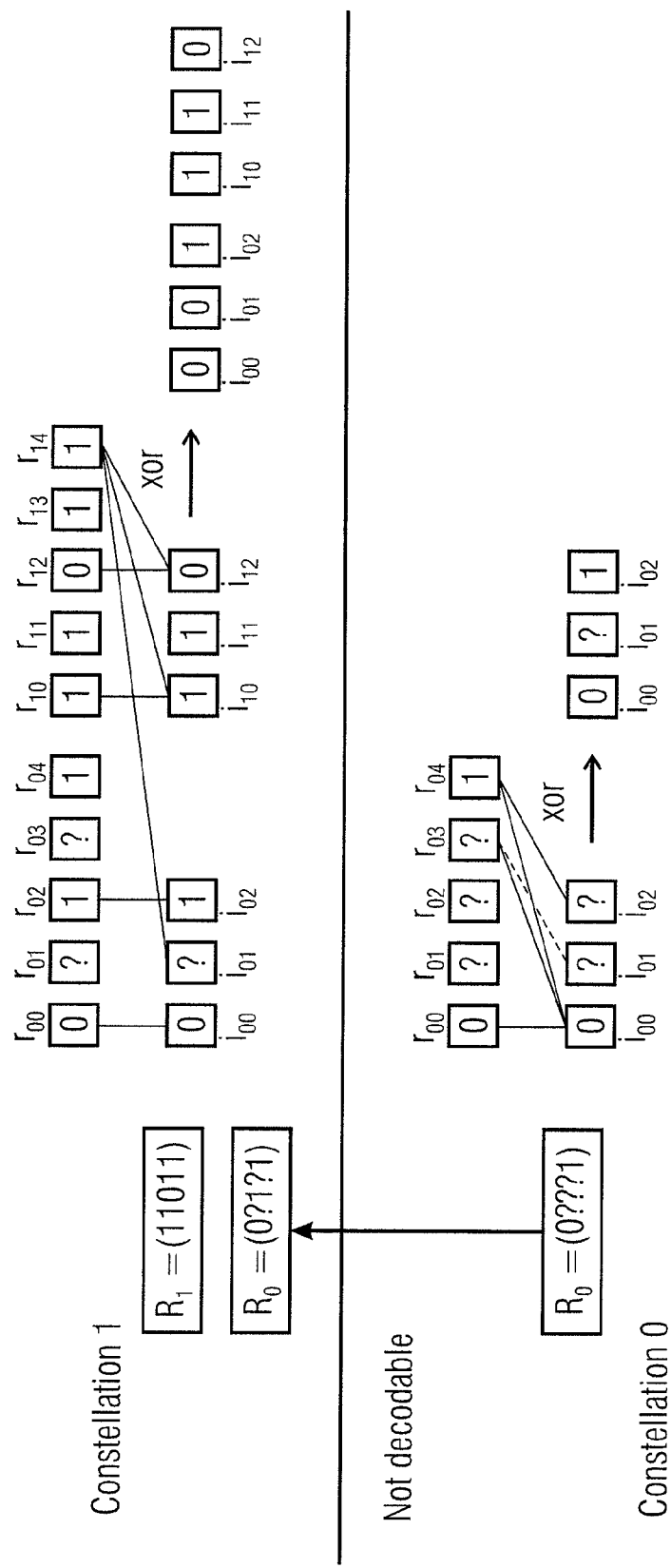
FIG. 8 shows a schematic for illustrating a decoding example for layered FEC with two layers, using an XORing code.

Exemplified decoding referring to encoding example in FIG. 6 is depicted in FIG. 8. If $p_1=n_1-k_1$ is the number of redundancy or parity symbols in layer 1 and $e_1$ is the number of lost symbols in layer 1 and each redundancy symbol is able to correct one lost symbol out of transmitted symbols of layer 1 and all lower layers, then the layers can be decoded if:

Constellation 0 for 1 layer:

$$p_0 \geq e_0$$

Constellation 1 for 2 successive layers:

$$p_0+p_1 \geq e_0+e_1 \text{ if } (p_1 \geq e_1)$$

Constellation 2 for 3 successive layers:

$$p_0+p_1+p_2 \geq e_0+e_1+e_2 \text{ if } (p_2 \geq e_2) \& (p_2+p_1 \geq e_2+e_1)$$

Constellation L-1 for L-1 successive layers:

$$\sum_{l=0}^{L-1} p_l \geq \sum_{l=0}^{L-1} e_l$$

if $(p_{L-1} \geq e_{L-1})$ & ... &$(p_{L-1} + ... + p_1 \geq e_{L-1} + ... + e_1)$ The number of parity symbols $p+_0$ for layer 0 in each constellation can be calculated as follows:
Constellation 0:

$$p+_0 = p_0$$

Constellation 1:

$$p+_0 = p_0 + (p_1 - e_1) \text{ if } (p_1 \geq e_1)$$

Constellation 2:

$$p+_0 = p_0 + (p_2 - e_2) + (p_1 - e_1) \text{ if } (p_2 \geq e_2) \& (p_2 + p_1 \geq e_2 + e_1)$$

Constellation L-1:

$$p+_0 = p_0 + \sum_{l=1}^{L-1}(p_l - e_l)$$

if $(p_{L-1} \geq e_{L-1})$ & ... &$(p_{L-1} + ... + p_1 \geq e_{L-1} + ... + e_1)$ Protection increase of enhancement layers l>0 can be decoded in the same way beside that protection of lower layers can not be used and successful decoding of lower layers is a requirement.

FIG. 8 depicts a decoding example with two layers. It is assumed, for example, that the encoder-side applied XOR combinations are known at the receiver. Erasures can the be corrected in the following way. Assume $R_0=(0???1)$ is the received code word for layer 0 and $R_1=(11011)$ for layer 1. The symbol "?" stands for a lost bit. In Constellation 0, the method and apparatus tries (step 52) to decode layer 0 with FEC 0 parity bits. Only bit $i_{02}$ can be corrected, and the other bit $i_{01}$ cannot be corrected due to insufficient parity bits. In next step (cp. step 58), the attempt is made to decode Constellation 1 combining FEC 0 and FEC 1. With concatenation to upper layers, the lost bit can be corrected and both layers can be successfully decoded (step 64).

The layered FEC thus described adds additional dependencies in upper layers parity bits. But due to the layer dependencies, correctly received higher enhancement layers are worthless without correct lower layers.

Figure 9:
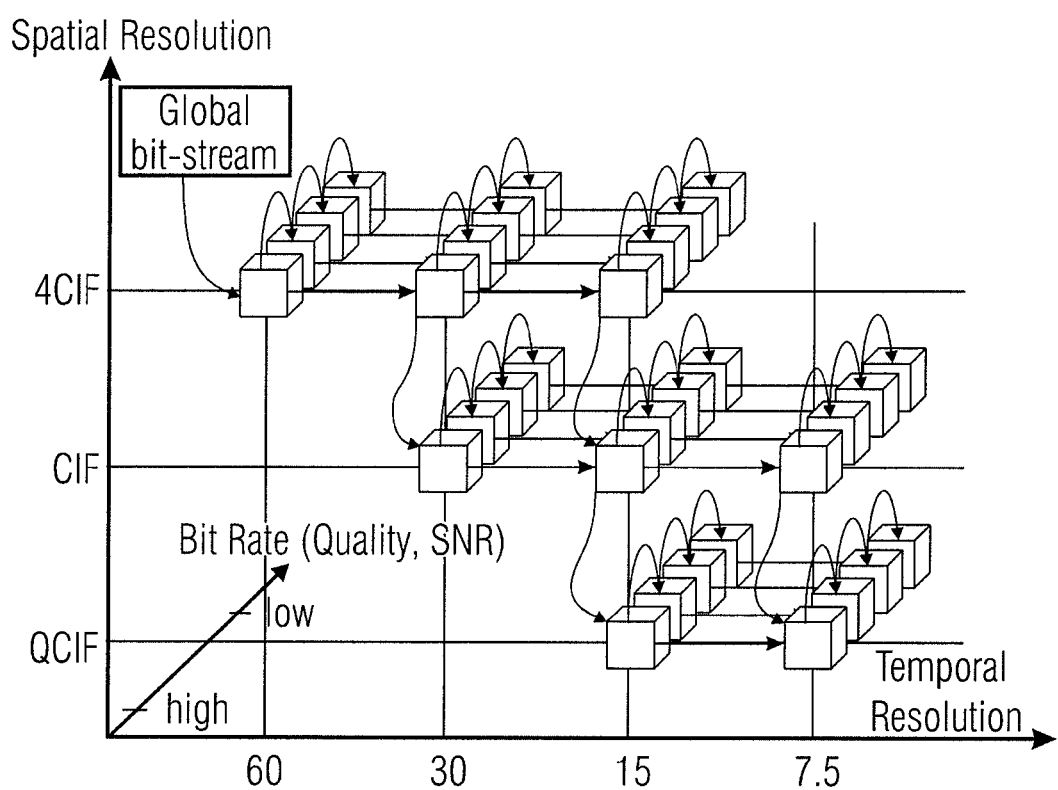
FIG. 9 shows a schematic illustrating a possible dependency structure of an SVC signal.

In the following, embodiments for multidimensional layered FED with scalable media streams are presented. When the above described layered FEC is extended by allowing different layered FEC encodings at the same time over different dimensions of scalable media, this is called multidimensional layered FEC (MDL FEC) in the following. Due to the scalability options of modern scalable media coding standards like SVC [A1] [A3] [A4], dependencies within the media stream can have multiple scalable dimensions. E.g. for an SVC media stream, the SNR quality, the frame rate as well as the resolution of the decode-able video may be changed at the same time by adding or removing layers. FIG. 9 illustrates a possible SVC dependency structure according to which a video signal provides temporal resolution, scalability in four levels, bit rate or SNR scalability in four levels and spatial resolution scalability in three levels. The individual blocks shown shall indicate disjoint portions of the SVC signal wherein the arrows therebetween point from higher level portions to lower levels portions from which the first ones depend.

Figure 10:
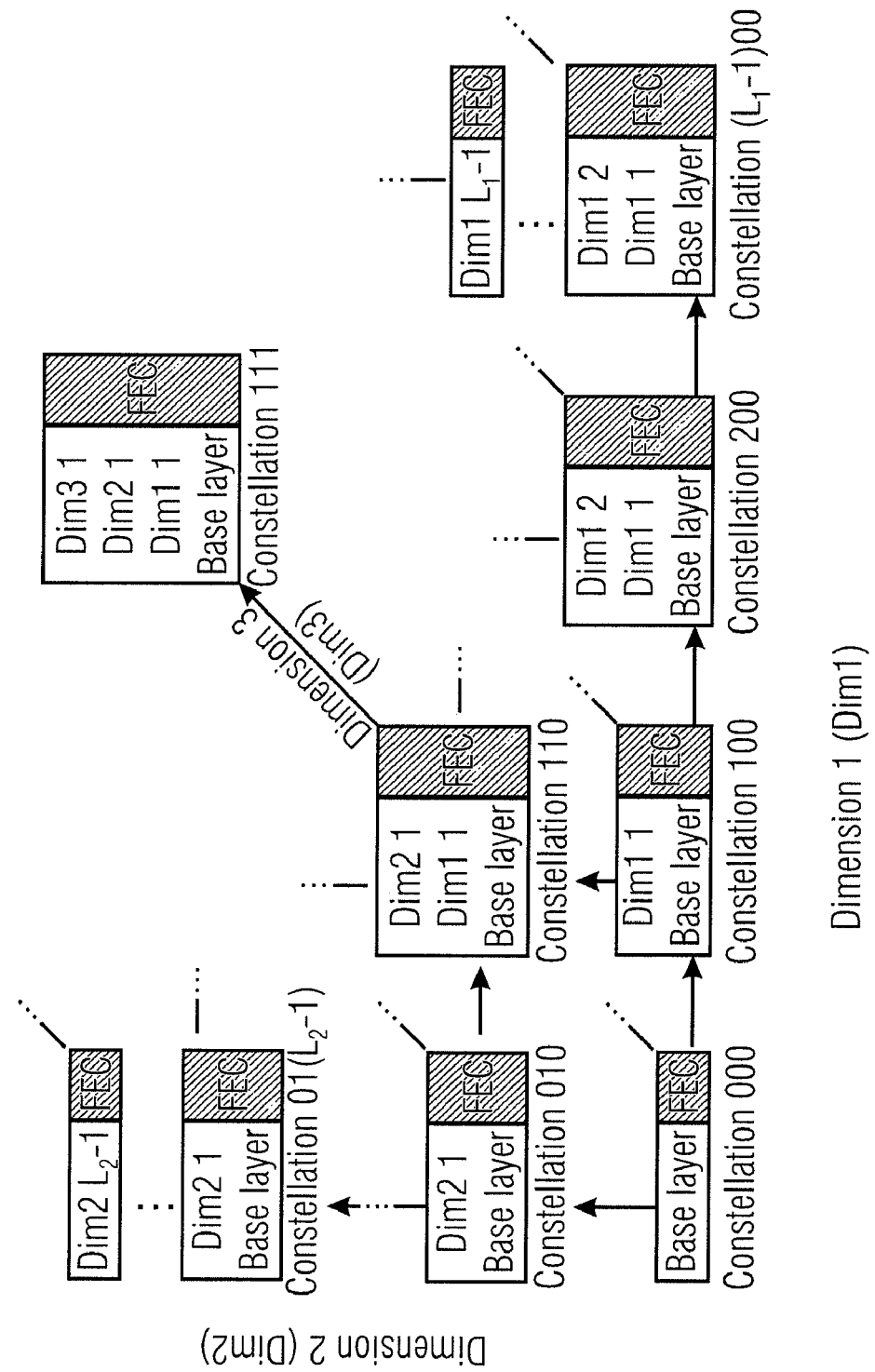
FIG. 10 shows a schematic for illustrating possible decoding constellations with layered FEC and multidimensional dependency structures according to an embodiment.

In other words, layered FEC can be used for multi dimension dependency structures. Redundancy symbols may be constructed over all depending layers. Let $L_D$ be the number of layers of scalability dimension D. FIG. 10 exemplarily depicts possible MDL FEC constellation for D=3. However, any number of dimensions D>3 is also possible, as well as any number of dimensions D smaller than D=2.

In FIG. 10, the base layer is exemplarily included in all FEC constructions. This complies with the embodiments shown in FIGS. 1a-1c. Therefore there are multiple paths for successful error correction. The MDL FEC of FIG. 10 is constructed in a way, that all dimensions on the path through the multidimensional scalability space are included in the construction of redundancy symbols, i.e. for a particular L-dimensional Constellation $\{D_0, ..., D_{L-1}\}$ the source symbols of all Constellations with $d<D_L$, with $0<1\leq L-1$ are used for constructing the redundancy symbols. That allows for increasing the probability of reconstructing a Constellation $\{d_0, ..., d_{L-1}\}$ on a path through the multidimensional scalability space, without increasing the number of redundancy symbols.

If, for example, an error occurs in the base layer, successive constellations beginning with Constellation 000 are tested for correction. If Constellation 000 fails constellations with two successive layers, as shown in FIG. 10 with Constellation 100, 010, 001 are used and so on.

Figure 11:
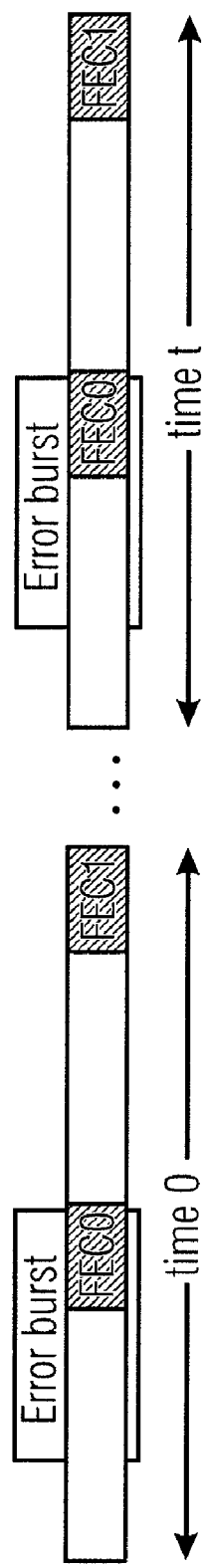
FIG. 11 shows a schematic of an information signal with illustrating an exemplarily occurring error burst.

A transmission of scalable media streams with MDL FEC may offer advantages. For example, in some scenarios like e.g. unequal error protection [A5] or layered multicast [A6], it is meaningful to transmit layers separately. In such a case MDL FEC increases decoding probability for lower layers of dimensions. FIG. 11 depicts an example of two dependent layers with layered FEC. An error burst is shown to occur in lower layer.

If the lower layer is affected by a such an error burst, unaffected higher enhancement layers can additionally be used for decoding subjacent layers without additional redundancy symbols.

Figure 12:
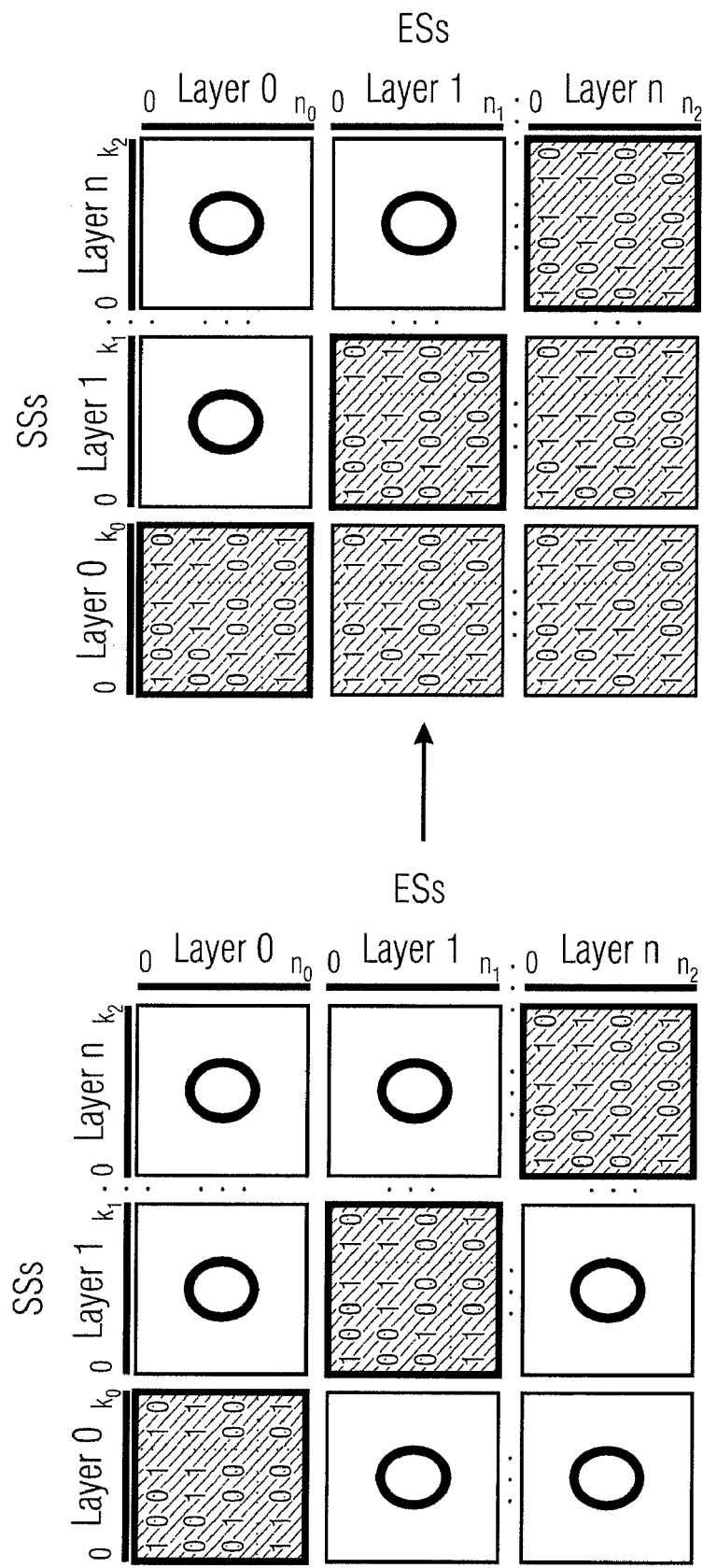
FIG. 12 shows an example for a possible generator matrix for layered LT-encoding.

The above embodiment can be used with LT-Codes (compare [A7]) with an encoding and decoding matrix extension, as depicted on the right-hand side in FIG. 12. SSs are source symbols of the unprotected information signal as output by, for example, portion generator 26 of FIG. 2, and ESs are the encoding symbols as included, for example, in the protected information signal output at output 24 in FIG. 2. Encoding symbols are calculated by XORing all SSs in one line with 1 in the encoding matrix of FIG. 12. In FIG. 12, the matrix at the left-hand side shows a generator matrix as it would be usable within the scheme shown in FIG. 19, according to which each of the disjoint layer portions would be FEC protected separately. As such, the matrix on the left-hand side is merely shown for comparison reasons. The generator matrix on the right-hand side shows that symbols of layers 0 and 1 are combined in order to achieve the encoding symbols ES for making up the protected disjoint layer data of layer 1 and that symbols of layers 0, 1 and 2 are combined in order to achieve the encoding symbols ES for making up the protected disjoint layer data of layer 2.

In effect, the generator matrix shown in FIG. 12 could be embodied by the FEC protector 28 shown in FIG. 2 wherein each module 28a to 28d would correspond with any of the lines of this generator matrix denoted by "layer 0", "layer 1" or "layer n" on the right hand side. In particular, layer-n module would perform different sums or other combinations between those km code words within the layer-m portions, with $0 \leq m < n$, which are indicated by the "ones" in the matrix of FIG. 12 in order to derive the $n_n$, with $n_n > m_n$, encoded code words representing both the redundancy information as well as the payload data of layer-n portion in a non-systematic way.

Figure 13:
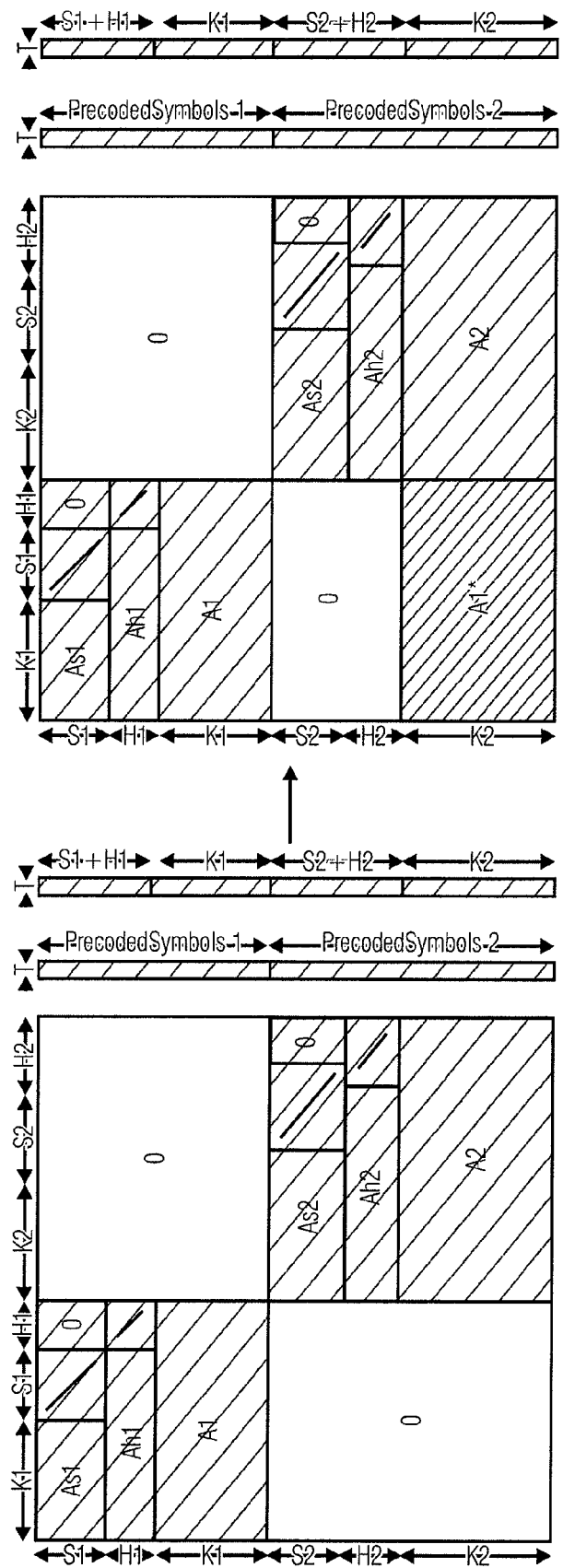
FIG. 13 shows a possible pre-coding matrix for a layered systematic Raptor-code.
Figure 19:
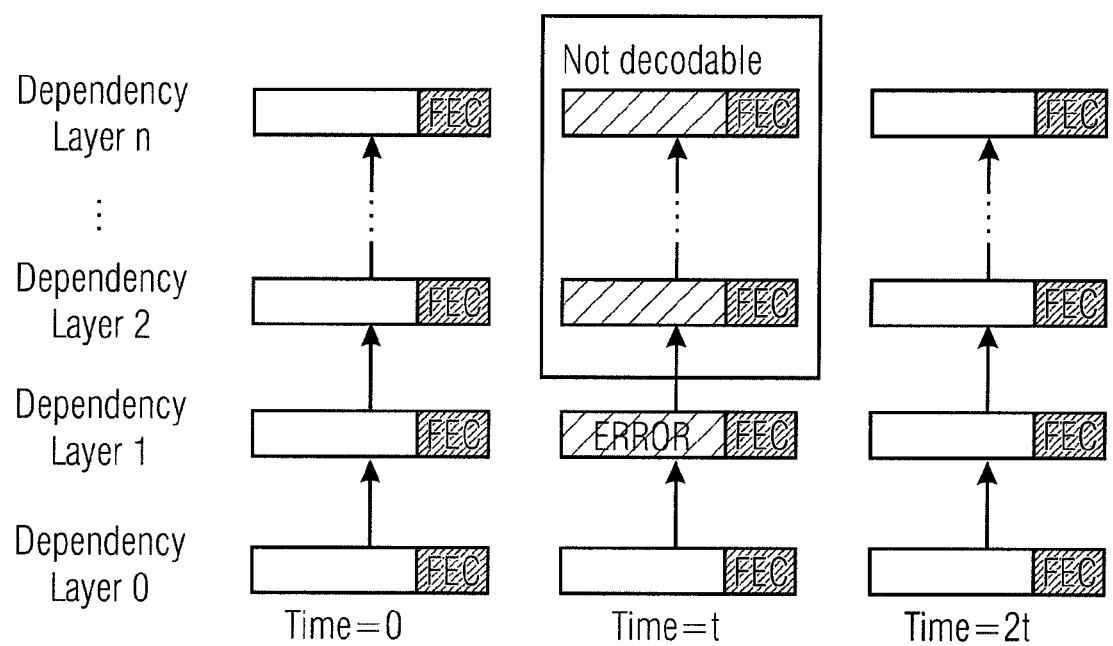
FIG. 19 shows a schematic illustrating enhancement layers not being decodable due to lost references in lower layers.

The above embodiments can even be used with non-systematic and systematic Raptor-Codes (compare [A8]) with encoding and decoding matrix extension depicted in FIG. 12 and additional preceding matrix extension depicted in FIG. 13 (for systematic encoding), wherein again, in FIG. 13, the matrix at the left-hand side shows a possible preceding matrix as it would be usable within the scheme shown in FIG. 19, according to which each of the disjoint layer portions would be FEC protected separately, whereas the left-hand side matrix could be used as when implementing layered FEC by use of Raptor codes. As a precautionary measure only it is noted that FIG. 13 assumes the number of layers to be 2 whereas in FIG. 12, the number of layers is 3. As can be seen, by the preceding matrix of FIG. 13, the symbols of a higher layer are precoded by combining them with lower layer symbols. Carefully setting the combination part of the preceding matrix (lower left-hand part of the right-hand matrix in FIG. 13) results in a systematic code when applying the right-hand matrix of FIG. 12. As can be seen, only a part A1* of the combination area of FIG. 13 matrix has to be set, the remaining part may be set to zero.

Further, the above embodiments can be used with LDPC-Codes (see [A9]) with an extended parity matrix similar to extended encoding matrix of LT-Code, or with linear block codes (see, for example [A2]).

The embodiments described above can be combined with scalable media codecs. The scalable media codecs may be scalable video and audio codecs, for example, and can be combined with scalable media codecs that have a one-dimensional or multi-dimensional dependency structure. In the latter case, the multi-dimensional dependency structure may be adopted to form the MDL FEC as described above. In general, the above embodiments can be applied for the protection of any data set including computer graphics, scene description, meta-data, semantic data, where the usefulness of one subset of the data depends on the correctness of another subset of the data.

Before describing embodiments using rateless codes in more detail, the following section gives a brief overview over rateless codes with focus on Luby transform code and raptor code. Again, scalable video coding is used as an illustrative application embodiment. The extension of rateless codes to layered FEC approach will be explained then along with the presentation of some selected results.

Rateless or fountain codes—rateless codes and fountain codes are synonyms—are error correction codes mainly used in environments with packet losses. It can produce a theoretical infinite number n of encoding symbols (ESs) from a limited number k of source symbols (SSs) with low complexity due to sparse coding matrices. For successful decoding the number of received symbols Erec has to be higher than $k+\lambda$, where $\lambda$ stands for the necessary decoding overhead, which is around 3% to 5% of original source symbols k depending on used FEC technique T. The difficulty in design of rateless codes lies in developing an algorithm to produce a theoretical infinite number of unique sets of XOR combinations P providing a balance between source symbol coverage and sparse matrix allocation influencing the value of $\lambda$ on one side and complexity on the other side.

First practical solution of rateless code was proposed 2002 by Michael Luby with the Luby Transform (LT) code [A7].

Figure 14:
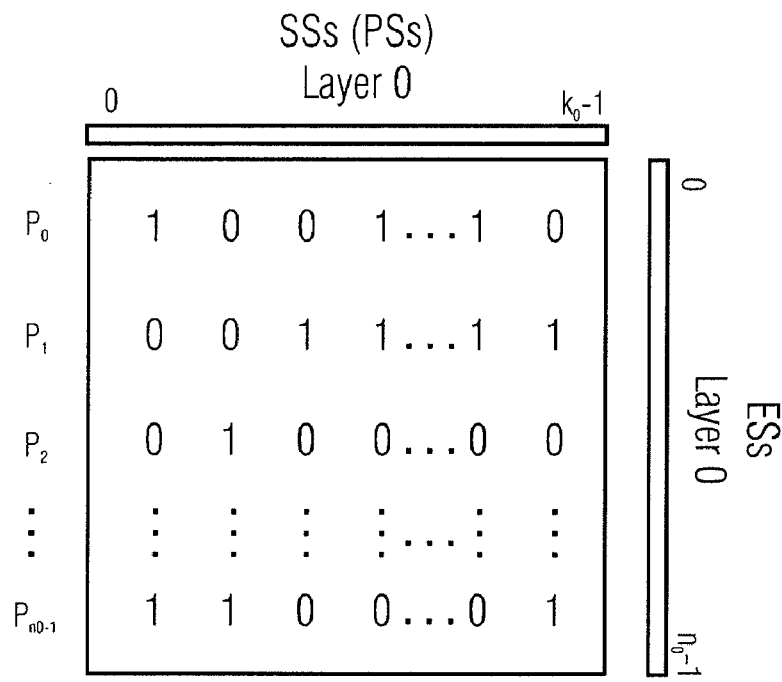
FIG. 14 shows an example for an LT-code encoding matrix $G_{LT}$.

First input data is divided in k SSs, each of size t. Generation of encoding symbols is done by computing for each $E_i$ a different XOR combination of d source symbols defined by set Pi where the number of included source symbols d is called degree. Each set $P_i$ is randomly generated from a suitable degree distribution where i denotes the unique identification number (ESI) which is used as the random seed for the pseudo-random generator. The ESI number is passed to the decoder along with the encoding symbol. Different XOR combination vectors $P_0, \ldots, P_{n-1}$ build the LT encoding matrix GLT which is depicted in FIG. 14.

Each encoding symbol $E_i$ of matrix row and ESI number i is generated by xor'ing all source symbols K with a Boolean 1 in combination set $P_i$. Complete encoding operation can be also expressed as:

$$E_{[0:n-1]} = G_{LT}(0, 1, \ldots, n-1) \cdot K \quad (1)$$

At receiver side XOR combinations Pi can be rebuilt with ESIs $i_{rec} \in \{0, \ldots, n-1\}$ of successful received encoding symbols $E_i$. If XOR combination sets of received encoding symbols have at minimum k successfully received linear independent XOR combinations k source symbols can be recovered by solving resulting system of equations.

Raptor codes are proposed in [B7]. They manage to reduce coding complexity by introducing an additional pre-code so that the coverage-constraint of source symbols for LT-Encoding is softened and a sparser matrix $G_{LT}$ with lower degree d is possible. Encoding is done in the same way like LT-Code but using pre-coded symbols F instead of source symbols K as source for LT-Encoding. Symbols F are calculated with an additional FEC generated by a s $\chi$ k generator matrix $G_p$, where s denotes the number of parity symbols $D_p$. Parity symbols are computed following equ. 2.

$$D_p = G_p \cdot K \quad (2)$$

The resulting encoding symbols E are computed with the pre-code symbols $F=[D_p K]$ as source for generator matrix $G_{LT}$ following equ. 1.

Figure 15:
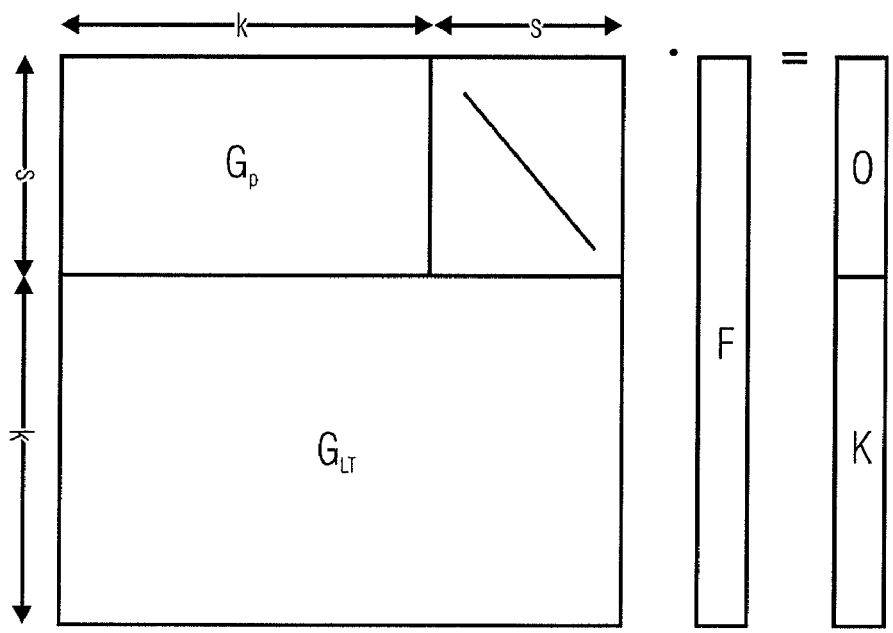
FIG. 15 shows a pre-coding matrix $G_{pSys}$ of Raptor-codes.

In most transmission systems direct access to original data is beneficial. Therefore in [B8] and [A8] a systematic version of raptor code is proposed where source symbols appear in the encoding symbols. Pre-code generation is slightly modified. To compensate xor'ing of source symbols in LT-code matrix $G_{LT}$ is also introduced in precode generation. FIG. 15 depicts systematic pre-coding matrix $G_{pSys}$.

The constraint introduced with $G_{LT}$ causes that LT-encoding of first k pre-coding symbols $F_0, \ldots, F_{k-1}$ results in original source symbols K and therefore in a systematic code. If $I_s$ stands for an sxs identity matrix pre-coding matrix $G_{pSys}$ is defined as:

$$G_{pSys} \triangleq \begin{bmatrix} G_p I_s \\ G_{LT} \end{bmatrix} \quad (3)$$

Precoding symbols $F_{sys}$ can then computed solving system of equations built by constraint process depicted in FIG. 15:

$$G_{pSys} \cdot F_{sys} = \begin{bmatrix} 0 \\ K \end{bmatrix} \quad (4)$$

The systematic raptor symbols $E_{[0:n-1]}$ are computed with the pre-code symbols $F_{sys}$ as source for generator matrix $G_{LT}$ following equ. 1.

Based on the above techniques, layered rateless codes can be constructed in the following way. In particular, to adopt the layered FEC scheme to systematic raptor codes, the encoding and pre-coding matrices, $G_{LT}$ and $G_{pSys}$, have to be modified for dependency layers l>0 following the procedure of layered FEC.

First extension of LT encoding matrix is shown. Standard LT encoding matrix $G_{LT}$ has dimension k×n. To extend xor'ing area to lower layers and keep code rate constant $G_{LTm}$ has to be extended for layer m with $k_l$ is the number of source symbols for layer l to a $$\left(\sum_{l=0}^{m} k_l \times n\right)$$

matrix.

To extend encoding matrix $G_{LTl}$ of layer l typical matrix can be concatenated with encoding matrices for lower layers building layered encoding matrix $G_{LayeredLT}(l)$:

$$G_{LayeredLT}(l)[G^*_{LT0}|G^*_{LT1}|\ldots|G_{LTl}] \quad (5)$$

Figure 16:
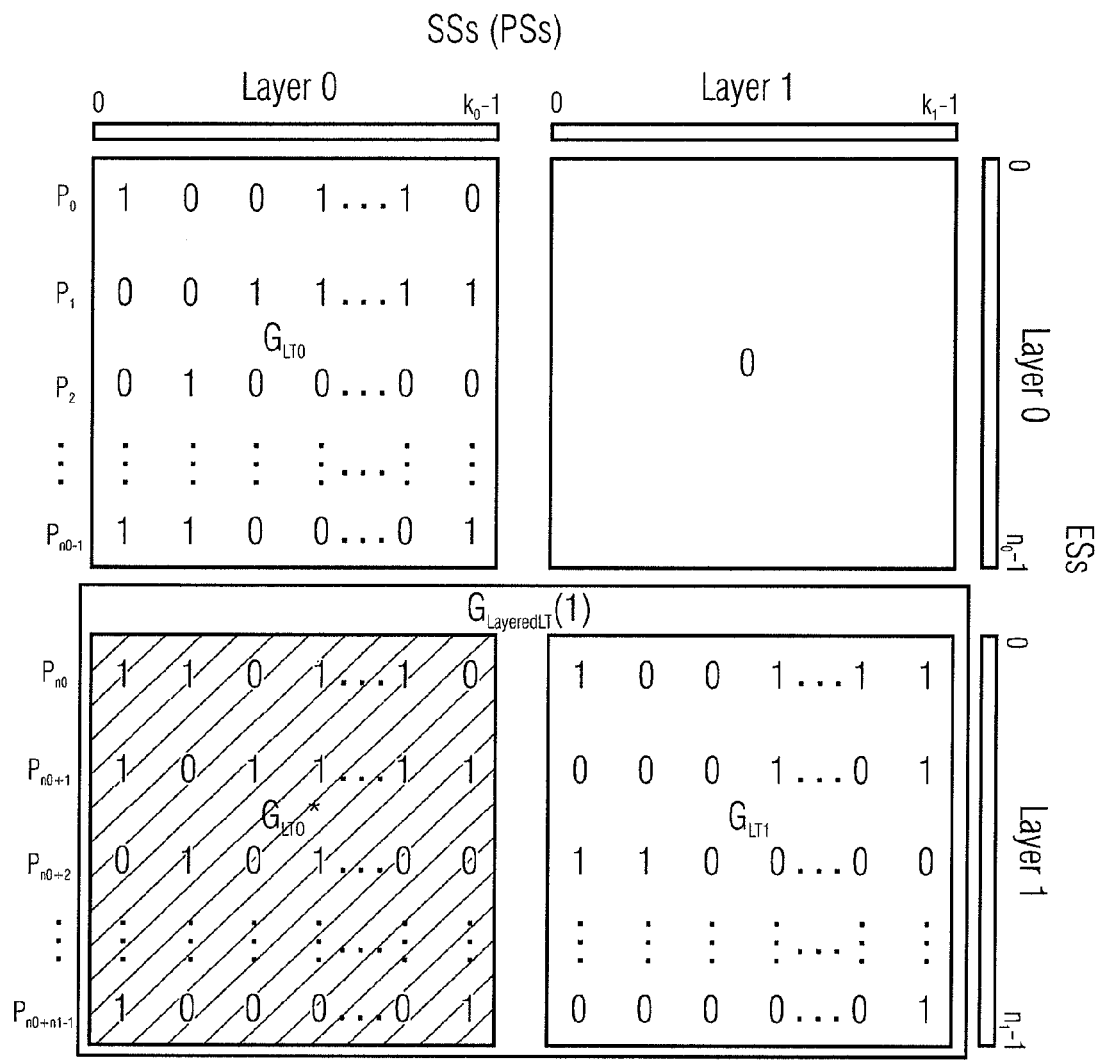
FIG. 16 shows a possible layered LT encoding matrix $G_{LT0}$ and $G_{layeredLT}(1)$ for two dependency layers.

With this procedure standard LT-code techniques can be used providing a smart degree distribution. To avoid double XOR combinations Pi in same layer concatenating encoding matrices $G^*_{LT0}, \ldots, G^*_{LT(m-1)}$ of lower layers l<m are generated by unused ESI numbers. This is possible due to the theoretically unlimited number of encoding symbols. FIG. 16 depicts layered LT encoding matrices $G_{LT0}$ and $G_{LayeredLT}(1)$ for exemplary two layers. Note that proposed extension can be applied to multiple layers.

Encoding symbols of layer l=0 are generated in typical way. Associated encoding matrix $G_{LT0}$ corresponds to the matrix depicted in FIG. 6 and each row consists of xor'ing sets $P_0, \ldots, P_{n0-1}$ which are generated with ESI numbers i=0, ..., $n_0-1$ as random seed. For encoding symbols generation of layer l=1 standard matrix $G_{LT1}$ is concatenated with matrix $G_{LT1}$ where each xor'ing set $P_i$ is built with successive unused ESI numbers i=$n_0, \ldots n_0+n_1-1$. Layered FEC encoding symbols for layer l=1 are calculated with:

$$E_{1[0:n1-1]} = G_{LayeredLT}(1)(0, 1, \ldots, n_1-1) \cdot K_1 \quad (6)$$

Encoding symbols of layer 1 represent an XOR combination of both layers and can be used to help decoding subjacent layer l=0 following the layered FEC approach described above.

Due the LT-encoding matrix extension raptor code is no longer systematic. Systematic behavior can be reconstructed by adding additional constraints to pre-coding matrix $G_{pSys}$. For a systematic code pre-code has to guarantee, that encoding symbols generated by layered LT-encoding contain original source symbols. Following equ. 3 modified layered pre-coding matrix $G_{LayeredpSys}(l)$ of layer l is defined as:

$$G_{LayeredpSys}(l) = \begin{bmatrix} 0 & G_{p1} I_s \\ G_{LayeredLT} & (l) \end{bmatrix} \quad (7)$$

Figure 17:
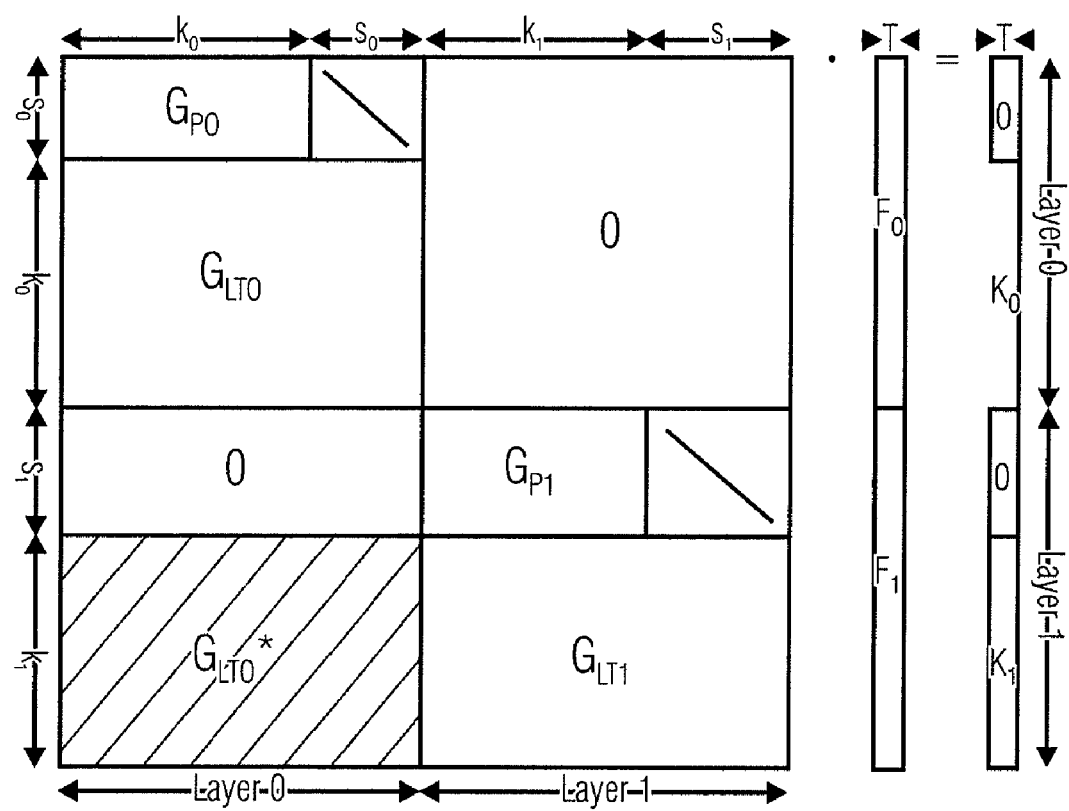
FIG. 17 shows a possible layered pre-coding matrix $G_{pSys}(0)$ and $G_{layeredpSys}(1)$ for two dependency layers.

Adding $G_{LayeredLT}(1)$ instead of $G_{LT}$ compensates matrix extension in LT encoding matrix. In FIG. 17 a layered pre-coding matrix for two layers is depicted, where $G_{LayeredLT}(1) \hat{=} [G_{LT0}*G_{LT1}]$. Precode symbols FSys0 are calculated in typical way whereas precode symbols of layer 1 $F_{sys1}$ are calculated with solving layered constraint process in equ. 8.

$$G_{LayeredpSys}(1) \cdot F_{sys1} = \begin{bmatrix} 0 \\ K_1 \end{bmatrix} \quad (8)$$

Finally encoded symbols of layered systematic raptor are generated following equ. 6 with:

$$E_{1[0:n_1-1]} = G_{LayeredLT}(1)(0, 1, \ldots n_1-1) \quad (9)$$

Encoding symbols $E_{1[0:n_1-1]}$ of layer 1 are an rateless XOR combination of layer 0 and 1 whereas first $E_{1[0:k_1-1]}$ symbols correspond to the original source symbols $K_1$.

Selected simulation results yielded based on the above layered FEC Raptor code are presented in the following. The performance of a rateless code can in general be measured by the additional symbol overhead Δ necessary for successful decoding. The following results show that proposed layered rateless raptor has the same decoding probability than standard raptor. For simulation raptor encoding software referring to proposed implementation in [A8] had been extended to the layered FEC approach.

Figure 18:
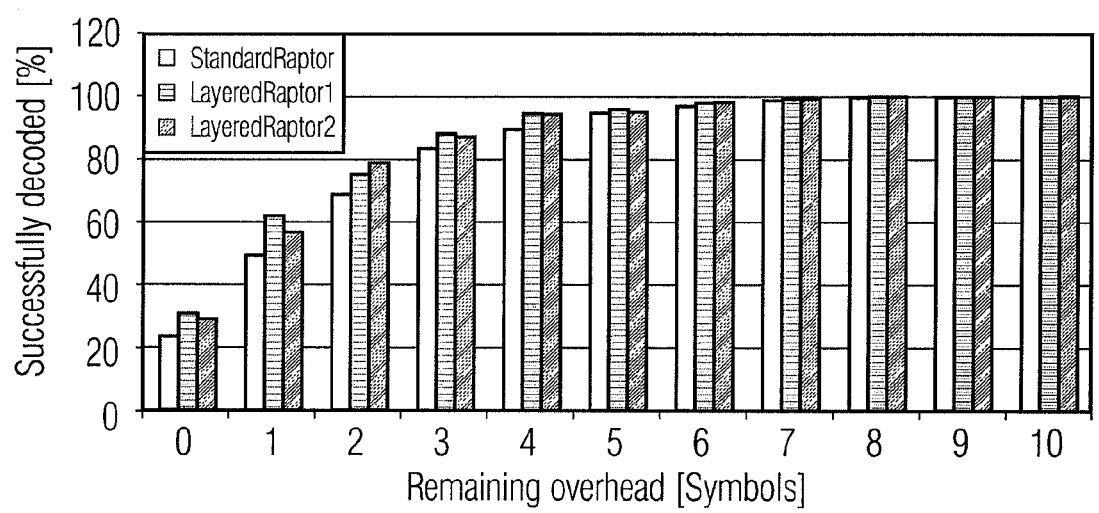
FIG. 18 shows a histogram plot illustrating a performance of a Raptor-code with k=1200 source symbols and n=20 encoding symbols of size t=48 byte.

For standard raptor coding input data consists of k=1200 source symbols of size t=48 Byte. As is shown in FIG. 18, with an additional overhead of p=20 repair symbols random losses drops any raptor symbol. In FIG. 18, at x-axis remaining number of additional repair symbols is plotted whereas y-axis shows percentage of successful encoding of 3000 test runs.

The performance of a rateless code can in general be measured by the additional symbol overhead n necessary for successfully decoding like also outlined in [B8] meaning that there are slightly more received than source symbols necessary for reconstructing the original symbols. Each raptor symbol may be an XOR combination of a specific number of random source symbols. Decoding can be done by solving an linear equation system built up on the XOR combinations of received symbols. The equation system can then only be solved if received symbols are generated with enough linear independent equations.

The layered FEC approach according to above embodiments may add additional XOR combinations to lower layers in higher layer encodings. Therefore when decoding multiple layered FEC layers there are more equations for lower layers available and the probability that there are enough linear independent equations available increases.

In FIG. 18, two layers are simulated with and without layered FEC approach. The number of source symbols for each layer is k=1024 with symbol size t=48. Second layer depends on first layer. The decoding probability of the lowest layer is shown at y-axis over the additional number of received raptor symbols (remaining symbols) n=r−k where r stands for the number of received symbols. The plot shows that due to the additional XOR combinations for the lowest layer the decoding probability increases with layered FEC approach. A similar effect is shown in [A10].

In particular, selected simulation results for a layered transmission in a specific wireless multicast environment are presented. A layered transmission of SVC protected by layered rateless FEC at application layer is applied to an DVB-H [B10] [B11] video service. MPE-FEC protection remains unused and a Gilbert-Elliot (GE) model [B12] had been used as stochastic model for simulation of losses of DVB-H transport packets. GE is widely used because of its simplicity while it still produces a good representation of errors in a wireless channel. A GE can have two states, a good state g and a bad state b and is defined over transition probabilities between these states. Therefore there are four probabilities depicted in transmission matrix T in equ. 10.

$$T = \begin{bmatrix} p_{gg} & p_{gb} \\ p_{bg} & p_{bb} \end{bmatrix} \quad (10)$$

Transition probabilities has been calculated for real measured loss pattern following calculation in [B13] for pgg and $p_{bb}$ with average error rate E and average error burst length B as depicted in equation 11 and 12. With $p_{gb}=1-p_{gg}$ and $p_{bg}=1-p_{bb}$ complete transition matrix T of distinct loss pattern can be determined.

$$E = \frac{1 - p_{gg}}{2 - p_{gg} - p_{bb}} \quad (11)$$

$$B = \frac{1}{1 - p_{bb}} \quad (12)$$

Loss patterns are measured from a real DVB-H channel using 16 QAM modulation and 8 k FFT mode without using MPE-FEC. Different reception qualities at different Doppler-frequencies had been measured resulting in different loss behavior.

To show the effect of layered FEC we compared transmitting two different resolutions with SVC. Base layer has QVGA resolutions at 25 fps and extension layer provides VGA resolution with 25 fps too. Base layer is encoded with typical systematic raptor code and some additional redundancy symbols controlled by code rate $c_0$. Higher VGA layer depends on successful received QVGA layer. Therefore layered FEC is applied to this layer with additional redundancy symbols controlled by code rate c1 also protecting lower layers. A VGA receiver is simulated receiving upscaled QVGA resolution if highest layer is lost due to transmission errors. Three FEC protection schemes with normal and layered FEC has been compared. First is with equal error protection, second with UEP and higher protection in lower layer and third with UEP and higher protection in upper layer to show effect of layered FEC. Code rate is adjusted, that total bit rate of all protection schemes is equal.

In the other words, the above embodiments show an approach for adopting layered FEC to rateless code especially systematic raptor code. To achieve dependency layer comprehensive FEC generation and to maintain systematic behavior encoding and preceding matrices had been extended simultaneous. Simulation results have shown that performance of layered raptor FEC has constant performance and outperforms standard FEC protection. The above embodiments are useable in modern layered or scalable video coding technologies which produce a video bit stream with various inter layer dependencies due to references to other layers. A method to concatenate forward error correction codes along the lines of existing dependency structures may be adopted to rateless codes. So called layered FEC increases protection of lower and more important layers without increasing the overall amount of FEC redundancy symbols. Additionally, the above embodiments may be adopted to rateless LT- and Raptor-codes. Performance gain of layered FEC is shown in simulation results with layered multicast transmission using scalable video coding (SVC).

However, again it is noted that the above embodiments are not restricted by the special embodiments with respect to video coding or LT and Raptor codes. For example, digital Fountain (DF) codes (see [A10]) could be used. Such digital Fountain codes are sparse-graph codes having a key property in that the source data can be recovered from any subset of the encoded packets, given that enough packets are received. The DF-codes are rateless in the sense that the number of symbols generated from the source data can be potentially infinite and can be determined on the fly. Further, the DF-codes are universal in that the symbol length for these codes may be arbitrary, from 1-bit binary symbols to general-L-bit symbols, without affecting the coding and decoding efficiency. An example for a DF-code is an LT-code. Further, beside LT and Raptor codes an LDPC code or an online code may be used. The FEC code being used may be designed such that same enables to gain an over-determined equation system by collecting the layered FEC protected data according to the above embodiments so that the above advantages with respect to the increase in FEC correction regarding the lower level data results. As to the scalability dimensions, for example, they max be selected from temporal sampling resolution, spatial sampling resolution, view number, audio channel number, stereoscopy/non-stereoscopy, and sample value bit depth.

Depending on an actual implementation, the inventive scheme can be implemented in hardware or in software. Therefore, the present invention also relates to a computer program, which can be stored on a computer-readable medium such as a CD, a disk or any other data carrier. The present invention is, therefore, also a computer program having a program code which, when executed on a computer, performs the inventive method in connection with the above figures.

Furthermore, it is noted that all steps or functions indicated in the flow diagrams could be implemented by respective means in the encoder and that the implementations may comprise subroutines running on a CPU, circuit parts of an ASIC or the like.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LIST OF REFERENCES

[A1] ITU-T and ISO/IEC JTC 1, Advanced video coding for generic audiovisual services, ITU-T Recommendation H.264 and ISO/IEC 14496-10 (MPEG-4 AVC), Version 1: May 2003, Version 2: May 2004, Version 3: March 2005, Version 4: September 2005, Version 5 and Version 6: June 2006, Version 7: April 2007, Version 8 (including SVC extension): Consented in July 2007.

[A2] A. Bouabdallah, J. Lacan, Dependency-aware unequal erasure protection codes, Journal of Zhejiang University SCIENCE A 2006 7(Suppl. I):27-33

[A3] H. Schwarz, D. Marpe, and T. Wiegand, Overview of the Scalable Video Coding Extension of H.264/AVC, IEEE Transactions on Circuits and Systems for Video Technology, Special Issue on SVC, to be published in October 2007

[A4] Y.-K. Wang, M. M. Hannuksela, S. Pateux, and A. Eleftheriadis, System and Transport Interface to SVC, IEEE Transactions on Circuits and Systems for Video Technology, Special Issue on SVC, to be published in October 2007

[A5] B. Girod, U. Horn and B. Belzer, Scalable Video Coding With Multiscale Motion Compensation And Unequal Error Protection, in Proc. International Symposium on Multimedia Communications and Video Coding, New York, October 1995

[A6] S. McCanne, V. Jacobson and M. Vetterli, Receiver-driven layered multicast. In Proc. of ACM SIGCOMM'96, pages 117-130, Stanford, Calif., August 1996

[A7] M. Luby, "LT-codes", in Proceedings of the ACM Symposium on Foundation of Computer Science (FOCS), 2002

[A8] M. Luby, A. Shokrollahi, M. Watson and T. Stockhammer, Raptor Forward Error Correction Scheme for Object Delivery, draft-ietf-rmt-bb-fec-raptor-object-09 (work in progress), Jun. 28, 2007

[A9] R. G. Gallager, Low-Density Parity-Check Codes, IRE Trans. Inform. Theory, vol. IT-8, pp. 21-28, January 1962

[A10] Mattia C. O. Bogino, Pasquale Cataldi, Marco Grangetto, Enrico Magli, Gabriella Olmo, "Sliding-Window Digital Fountain Codes for Streaming of Multimedia Contents", IEEE 2007

[B3] A. Albanese, J. Blomer, J. Edmonds, M. Luby and M. Sudan, "Priority encoding transmission," IEEE Trans. on Information Theory, 42(6):1737-1744, 1996.

[B7] A. Shokrollahi, "Raptor codes," Digital Fountain, Tech. Rep. DR2003-06-001, June 2003.

[B8] M. Luby, M. Watson, T. Gasiba, T. Stockhammer and W. Xu, "Raptor Codes for Reliable Download Delivery in Wireless Broadcast Systems," IEEE CCNC, Las Vegas, Nev., January 2006.

[B10] ETSI TS 102 468 (V1.1.1), Digital Video Broadcasting (DVB); IP Datacast over DVB-H: Set of Specifications for Phase 1, April 2006.

[B11] ETSI TS 102 005 (V1.2.1), Digital Video Broadcasting (DVB); Specification for the use of Video and Audio Coding in DVB services delivered directly over IP Protocols, April 2006

[B12] E. N. Gilbert, "Capacity of a burst-noise channel," Bell Systems Technical Journal, vol. 39, pp. 12531265, 1960.

[B13] M. Hannuksela, V. Vadakital and S. Jumislo-Pyykk, "Comparison of Error Protection Methods for Audio-Video Broadcast over DVB-H", EURASIP Journal on Advances in Signal Processing Volume 2007, Article ID 71801, 12 pages, 2007.

The invention claimed is:

1. Apparatus for error correcting an information signal being scalable so that portions of the information signal represent an information content at different levels of quality, wherein at least a first one of the plurality of portions representing the information content at a first one of the different levels higher than a second one of the different levels at which a second one of the plurality of portions represents the information content, overlaps with the second portion, wherein the information signal is FEC protected by each of the different levels having redundancy information associated therewith such that each redundancy information is dependent on the respective portion representing the information content at the respective level, and the redundancy information associated with the first level is dependent on the first portion including a part thereof overlapping the second portion, the apparatus comprising:

corrector for correcting an error of the information signal within the second portion by use of the redundancy information associated with the first and second levels and a part of the first portion disjoint to the second portion; and deriver for deriving the information content at the second level of quality from the error corrected second portion with discarding the part of the first portion;

wherein the information signal is scalable in a plurality of dimensions so that portions of the information signal represent information content at different constellations of respective levels of the plurality of dimensions, wherein the first one of the plurality of portions representing the information content at a level of a first one of the plurality of dimensions higher than a level in the first dimension at which the second one of the plurality of portions represents the information content, overlaps with the second portion, wherein at least a third one of the plurality of portions being different from the first portion and representing the information content at a level of a second one of the plurality of dimensions higher than a level in the second dimensions at which a fourth one of the plurality of portions represents the information content, overlaps with the fourth portion, wherein the information signal is FEC protected by each of the different constellations having redundancy information associated therewith such that each redundancy information is dependent on the respective portion representing the information content at the respective constellation, the redundancy information associated with the constellation at which the first portion represents the information content is dependent on the first portion including a part of the first portion overlapping the second portion, and the redundancy information associated with the constellation at which the third portion represents the information content is dependent on the third portion including a part thereof overlapping the fourth portion.

2. Apparatus according to claim 1, wherein the second portion is equal to the fourth portion.

3. Apparatus according to claim 1, wherein the second and fourth portions overlap each other.

4. Apparatus according to claim 3, wherein a fifth one of the plurality of portions representing the information content at the level of the first dimension at which the first portion represents the information content, and the level of the second dimension at which the third portion represents the information content, overlaps with the first and third portions so that the first and third portions are proper subsets of the fifth portion, and the redundancy information associated with the constellation at which the fifth portion represents the information content is dependent on the fifth portion including a part thereof overlapping the second and fourth portions, a part thereof overlapping the first portion but being disjoint to the second and fourth portions, and a part thereof overlapping the third portion but being disjoint to the second and fourth portions.

5. Apparatus according to claim 1, wherein the second portion is a proper subset of the first portion, and the fourth portion is a proper subset of the third portion.

6. Apparatus according to claim 1, wherein, for each portion, the respective redundancy information depends on that part of the respective portion which overlaps with any of the other of the plurality of portions.

7. Apparatus according to claim 1, wherein each portion is individually decodeable to obtain the information content at the respective constellation without necessitating any information from the compliment of the respective portion in the information signal.

8. Apparatus according to claim 1, wherein, for each portion, the respective redundancy information is associated with the respective portion via a systematic code.

9. Apparatus according to claim 1, wherein, for each portion, the respective redundancy information is associated with the respective portion via a non-systematic code.

10. Apparatus according to claim 1, wherein the information signal is arranged as a data stream of consecutive time frames, wherein within each time frame, a part of the data stream concerning redundancy information associated with the constellation at which the first portion represents the information content succeeds a part of the data stream concerning the second portion and a part of the data stream concerning redundancy information associated with the constellation at which the second portion represents the information content precedes a part of the data stream concerning a part of the first portion disjoint to the second portion, and a part of the data stream concerning redundancy information associated with the constellation at which the third portion represents the information content succeeds a part of the data stream concerning the fourth portion and a part of the data stream concerning redundancy information associated with the constellation at which the fourth portion represents the information content precedes a part of the data stream concerning a part of the third portion disjoint to the fourth portion.

11. Apparatus according to claim 1, wherein the redundancy information is based on an LT code, Raptor code, LDPC code or an online code.

12. Apparatus according to claim 1, wherein the information content comprises audio content, video content or 3D model content.

13. Apparatus according to claim 1, wherein the plurality of dimensions are selected from the group consisting of temporal sampling resolution, spatial sampling resolution, view number, audio channel number, stereoscopy/non-stereoscopy, and sample value bit depth.

14. Apparatus according to claim 1, wherein the protector is configured to FEC protect the information signal such that, for each portion, the respective redundancy information depends on that part of the respective portion which overlaps with any of the other of the plurality of portions.

15. Apparatus for error correcting an information signal being scalable so that portions of the information signal represent an information content at different levels of quality, wherein at least a first one of the plurality of portions representing the information content at a first one of the different levels higher than a second one of the different levels at which a second one of the plurality of portions represents the information content, overlaps with the second portion, wherein the information signal is FEC protected by each of the different levels having redundancy information associated therewith such that each redundancy information is dependent on the respective portion representing the information content at the respective level, and the redundancy information associated with the first level is dependent on the first portion including a part thereof overlapping the second portion, the apparatus comprising:
  corrector for correcting an error of the information signal within the second portion by use of the redundancy information associated with the first and second levels and a part of the first portion disjoint to the second portion; and
  deriver for deriving the information content at the second level of quality from the error corrected second portion with discarding the part of the first portion;
  wherein the information signal is scalable so that portions of the information signal represent a time instant of the information content at different levels of quality.

16. Apparatus according to claim 1, wherein the corrector is configured to
  firstly attempt to error correct the information signal within the second portion by use of the redundancy information associated with the second level, without use of the redundancy information associated with the first level and the part of the first portion disjoint to the second portion,
  if the first attempt is not successful, re-attempt to error correct the information signal within the second portion by use of the redundancy information associated with the second level, the redundancy information associated with the first level and the part of the first portion disjoint to the second portion.

17. Apparatus for error correcting an information signal being scalable so that portions of the information signal represent an information content at different levels of quality, wherein at least a first one of the plurality of portions representing the information content at a first one of the different levels higher than a second one of the different levels at which a second one of the plurality of portions represents the information content, overlaps with the second portion, wherein the information signal is FEC protected by each of the different levels having redundancy information associated therewith such that each redundancy information is dependent on the respective portion representing the information content at the respective level, and the redundancy information associated with the first level is dependent on the first portion including a part thereof overlapping the second portion, the apparatus comprising:
  corrector for correcting an error of the information signal within the second portion by use of the redundancy information associated with the first and second levels and a part of the first portion disjoint to the second portion; and
  deriver for deriving the information content at the second level of quality from the error corrected second portion with discarding the part of the first portion;
  wherein the information signal represents a 3D or audio information content and being scalable so that portions of the information signal represent the information content at different levels of quality.

18. Apparatus for encoding an information content into an information signal being scalable in a plurality of dimensions so that portions of the information signal represent the information content at different constellations of respective levels of the plurality of dimensions, comprising
  generator for generating the plurality of portions so that at least a first one of the plurality of portions representing the information content at a level of a first one of the plurality of dimensions higher than a level in the first dimension at which a second one of the plurality of portions represents the information content, overlaps with the second portion, and that at least a third one of the plurality of portions being different to the first portion and representing the information content at a level of a second one of the plurality of dimensions higher than a level in the second dimensions at which a fourth one of the plurality of portions represents the information content, overlaps with the fourth portion,
  protector for FEC protecting the information signal by associating redundancy information to each of the different constellations such that each redundancy information is dependent on the respective portion representing the information content at the respective constellation, the redundancy information associated with the constellation at which the first portion represents the information content is dependent on the first portion including a part of the first portion overlapping the second portion, and the redundancy information associated with the constellation at which the third portion represents the information content is dependent on the third portion including a part of the third portion overlapping the fourth portion.

19. Apparatus according to claim 18, wherein the generator is configured to generate the plurality of portions such that the second portion is equal to the fourth portion.

20. Apparatus according to claim 19, wherein the generator is configured to generate the plurality of portions such that the second and fourth portions overlap each other.

21. Apparatus according to claim 20, wherein the generator is configured to generate the plurality of portions such that a fifth one of the plurality of portions representing the information content at the level of the first dimension at which the first portion represents the information content, and the level of the second dimension at which the third portion represents the information content, overlaps with the first and third portions so that the first and third portions are proper subsets of the fifth portion, and the protector for FEC protecting is configured to FEC protect the information signal such that the redundancy information associated with the constellation at which the fifth portion represents the information content is dependent on the fifth portion including a part thereof overlapping the second and fourth portions, a part thereof overlapping the first portion but being disjoint to the second and fourth portions, and a part thereof overlapping the third portion but being disjoint to the second and fourth portions.

22. Apparatus according to claim 18, wherein the generator is configured to generate the plurality of portions such that the second portion is a proper subset of the first portion, and the fourth portion is a proper subset of the third portion.

23. Apparatus according to claim 18, wherein the generator is configured to generate the plurality of portions such that each portion is individually decodeable to obtain the information content at the respective constellation without necessitating any information from the compliment of the respective portion in the information signal.

24. Apparatus according to claim 18, wherein the protector is configured to FEC protect the information signal such that, for each portion, the respective redundancy information is associated with the respective portion via a systematic code.

25. Apparatus according to claim 18, wherein the protector is configured to FEC protect the information signals such that, for each portion, the respective redundancy information is associated with the respective portion via a non-systematic code.

26. Apparatus according to claim 18, wherein the generator is configured to generate the plurality of portions such that the information signal is arranged as a data stream of consecutive time frames, and wherein the protector is configured to FEC protect the information signal such that within each time frame, a part of the data stream concerning redundancy information associated with the constellation at which the first portion represents the information content succeeds a part of the data stream concerning the second portion and a part of the data stream concerning redundancy information associated with the constellation at which the second portion represents the information content precedes a part of the data stream concerning a part of the first portion disjoint to the second portion, and a part of the data stream concerning redundancy information associated with the constellation at which the third portion represents the information content succeeds a part of the data stream concerning the fourth portion and a part of the data stream concerning redundancy information associated with the constellation at which the fourth portion represents the information content precedes a part of the data stream concerning a part of the third portion disjoint to the fourth portion.

27. Apparatus according to claim 18, wherein the protector is configured to FEC protect the information signal such that the redundancy information is based on an LT code, Raptor code LDPC code or an online code.

28. Apparatus according to claim 18, wherein the information content comprises audio content, video content or 3D model content.

29. Apparatus according to claim 18, wherein the plurality of dimensions are selected from the group consisting of temporal sampling resolution, spatial sampling resolution, view number, audio channel number, stereoscopy/non-stereoscopy, and sample value bit depth.

30. Method for encoding an information content into an information signal being scalable in a plurality of dimensions so that portions of the information signal represent the information content at different constellations of respective levels of the plurality of dimensions, comprising generating the plurality of portions so that at least a first one of the plurality of portions representing the information content at a level of a first one of the plurality of dimensions higher than a level in the first dimension at which a second one of the plurality of portions represents the information content, overlaps with the second portion, and that at least a third one of the plurality of portions being different to the first portion and representing the information content at a level of a second one of the plurality of dimensions higher than a level in the second dimensions at which a fourth one of the plurality of portions represents the information content, overlaps with the fourth portion; and FEC protecting the information signal by associating redundancy information to each of the different constellations such that each redundancy information is dependent on the respective portion representing the information content at the respective constellation, the redundancy information associated with the constellation at which the first portion represents the information content is dependent on the first portion including a part of the first portion overlapping the second portion, and the redundancy information associated with the constellation at which the third portion represents the information content is dependent on the third portion including a part of the third portion overlapping the fourth portion.

31. Apparatus for encoding an information content into an information signal representing the information content and being scalable so that portions of the information signal represent a time instant of the information content at different levels of quality, comprising generator for generating the plurality of portions so that at least a first one of the plurality of portions representing the information content at a first one of the different levels higher than a second one of the different levels at which a second one of the plurality of portions represents the information content, overlaps with the second portion; and protector for FEC protecting the information signal by associating redundancy information to each of the different levels such that each redundancy information is dependent on the respective portion representing the information content at the respective level, and the redundancy information associated with the first level is dependent on the first portion including a part of the first portion overlapping the second portion.

32. Method for encoding an information content into an information signal representing the information content and being scalable so that portions of the information signal represent a time instant of the information content at different levels of quality, comprising generating the plurality of portions so that at least a first one of the plurality of portions representing the information content at a first one of the different levels higher than a second one of the different levels at which a second one of the plurality of portions represents the information content, overlaps with the second portion; and FEC protecting the information signal by associating redundancy information to each of the different levels such that each redundancy information is dependent on the respective portion representing the information content at the respective level, and the redundancy information associated with the first level is dependent on the first portion including a part of the first portion overlapping the second portion.

33. Method for error correcting an information signal being scalable so that portions of the information signal represent an information content at different levels of quality, wherein at least a first one of the plurality of portions representing the information content at a first one of the different levels higher than a second one of the different levels at which a second one of the plurality of portions represents the information content, overlaps with the second portion, wherein the information signal is FEC protected by each of the different levels having redundancy information associated therewith such that each redundancy information is dependent on the respective portion representing the information content at the respective level, and the redundancy information associated with the first level is dependent on the first portion including a part thereof overlapping the second portion, the method comprising:

correcting an error of the information signal within the second portion by use of the redundancy information associated with the first and second levels and a part of the first portion disjoint to the second portion; and deriving the information content at the second level of quality from the error corrected second portion with discarding the part of the first portion, wherein the information signal is scalable in a plurality of dimensions so that portions of the information signal represent information content at different constellations of respective levels of the plurality of dimensions, wherein the first one of the plurality of portions representing the information content at a level of a first one of the plurality of dimensions higher than a level in the first dimension at which the second one of the plurality of portions represents the information content, overlaps with the second portion, wherein at least a third one of the plurality of portions being different from the first portion and representing the information content at a level of a second one of the plurality of dimensions higher than a level in the second dimensions at which a fourth one of the plurality of portions represents the information content, overlaps with the fourth portion, wherein the information signal is FEC protected by each of the different constellations having redundancy information associated therewith such that each redundancy information is dependent on the respective portion representing the information content at the respective constellation, the redundancy information associated with the constellation at which the first portion represents the information content is dependent on the first portion including a part of the first portion overlapping the second portion, and the redundancy information associated with the constellation at which the third portion represents the information content is dependent on the third portion including a part thereof overlapping the fourth portion.

34. Method for error correcting an information signal being scalable so that portions of the information signal represent an information content at different levels of quality, wherein at least a first one of the plurality of portions representing the information content at a first one of the different levels higher than a second one of the different levels at which a second one of the plurality of portions represents the information content, overlaps with the second portion, wherein the information signal is FEC protected by each of the different levels having redundancy information associated therewith such that each redundancy information is dependent on the respective portion representing the information content at the respective level, and the redundancy information associated with the first level is dependent on the first portion including a part thereof overlapping the second portion, the method comprising:

correcting an error of the information signal within the second portion by use of the redundancy information associated with the first and second levels and a part of the first portion disjoint to the second portion; and deriving the information content at the second level of quality from the error corrected second portion with discarding the part of the first portion;

wherein the information signal is scalable so that portions of the information signal represent a time instant of the information content at different levels of quality.

35. Method for error correcting an information signal being scalable so that portions of the information signal represent an information content at different levels of quality, wherein at least a first one of the plurality of portions representing the information content at a first one of the different levels higher than a second one of the different levels at which a second one of the plurality of portions represents the information content, overlaps with the second portion, wherein the information signal is FEC protected by each of the different levels having redundancy information associated therewith such that each redundancy information is dependent on the respective portion representing the information content at the respective level, and the redundancy information associated with the first level is dependent on the first portion including a part thereof overlapping the second portion, the method comprising:

correcting an error of the information signal within the second portion by use of the redundancy information associated with the first and second levels and a part of the first portion disjoint to the second portion; and deriving the information content at the second level of quality from the error corrected second portion with discarding the part of the first portion;
wherein the information signal represents a 3D or audio information content and being scalable so that portions of the information signal represent the information content at different levels of quality.

36. Apparatus for encoding an 3D or audio information content into an information signal representing the 3D or audio information content and being scalable so that portions of the information signal represent the 3D or audio information content at different levels of quality, comprising
generator for generating the plurality of portions so that at least a first one of the plurality of portions representing the information content at a first one of the different levels higher than a second one of the different levels at which a second one of the plurality of portions represents the information content, overlaps with the second portion; and
protector for FEC protecting the information signal by associating redundancy information to each of the different levels such that
each redundancy information is dependent on the respective portion representing the information content at the respective level, and
the redundancy information associated with the first level is dependent on the first portion including a part of the first portion overlapping the second portion.

37. Method for encoding an 3D or audio information content into an information signal representing the 3D or audio information content and being scalable so that portions of the information signal represent the 3D or audio information content at different levels of quality, comprising
generating the plurality of portions so that at least a first one of the plurality of portions representing the information content at a first one of the different levels higher than a second one of the different levels at which a second one of the plurality of portions represents the information content, overlaps with the second portion; and
FEC protecting the information signal by associating redundancy information to each of the different levels such that
each redundancy information is dependent on the respective portion representing the information content at the respective level, and
the redundancy information associated with the first level is dependent on the first portion including a part of the first portion overlapping the second portion.

38. A non-transitory computer-readable medium having stored thereon a computer program enabling a computer, once it has been loaded into the computer's memory, to perform a method as claimed in any of claims 28, 15, 1 and 17.

* * * * *